United States Patent
Shimizu

(10) Patent No.: US 7,420,255 B2
(45) Date of Patent: Sep. 2, 2008

(54) SEMICONDUCTOR DEVICE INCORPORATING PROTECTIVE DIODE WITH STABLE ESD PROTECTION CAPABILITIES

(75) Inventor: Akira Shimizu, Kobe (JP)

(73) Assignee: Ricoh Company, Ltd., Tokyo (JP)

( * ) Notice: Subject to any disclaimer, the term of this patent is extended or adjusted under 35 U.S.C. 154(b) by 106 days.

(21) Appl. No.: 11/396,192

(22) Filed: Mar. 30, 2006

(65) Prior Publication Data
US 2006/0226499 A1   Oct. 12, 2006

(30) Foreign Application Priority Data
Mar. 31, 2005   (JP) ............... 2005-102773

(51) Int. Cl.
*H01L 27/95* (2006.01)
(52) U.S. Cl. .............. 257/409; 257/328; 257/355; 257/546
(58) Field of Classification Search .......... 257/170, 257/409, 328, 355, 546, 605, 173
See application file for complete search history.

(56) References Cited

U.S. PATENT DOCUMENTS

| | | | | |
|---|---|---|---|---|
| 4,868,135 A | * | 9/1989 | Ogura et al. ........... | 438/203 |
| 6,133,107 A | * | 10/2000 | Menegoli ................ | 438/306 |
| 6,580,131 B2 | * | 6/2003 | Huang et al. ............ | 257/355 |
| 6,924,531 B2 | * | 8/2005 | Chen et al. .............. | 257/336 |
| 7,071,518 B2 | * | 7/2006 | Parthasarathy et al. ... | 257/402 |
| 7,141,860 B2 | * | 11/2006 | Khemka et al. ......... | 257/471 |

FOREIGN PATENT DOCUMENTS

JP   2003-17694   1/2003

* cited by examiner

*Primary Examiner*—Eugene Lee
(74) *Attorney, Agent, or Firm*—Cooper & Dunham, LLP

(57) ABSTRACT

A semiconductor device provided with stable ESD protection capabilities, incorporating a transistor and a protective diode to form a power control IC. The semiconductor device includes a semiconductor substrate of a first conductivity type; a well region of a second conductivity type, formed in the semiconductor substrate; the transistor formed in the well region; a guard ring region of the second conductivity type having an impurity concentration higher than the well region, formed on the surface of the semiconductor substrate inside the periphery of, and spatially separated from the boundary of, the well region; a substrate pickup region of the first conductivity type having an impurity concentration higher than the semiconductor substrate, formed on the periphery of the well region in contact with the well region and the semiconductor substrate; and a thick oxide film formed on the surface of the semiconductor substrate between the guard ring region and the substrate pickup region. The protective diode is formed including the well region, the guard ring region, and the substrate pickup region.

17 Claims, 18 Drawing Sheets

SEMICONDUCTOR DEVICE INCORPORATING PROTECTIVE DIODE WITH STABLE ESD PROTECTION CAPABILITIES

FIELD OF DISCLOSURE

This disclosure generally relates to semiconductor devices, and more specifically to a semiconductor device provided with stable ESD (electro-static discharge) protection capabilities, incorporating a transistor formed inside a well region and a protective diode formed on the periphery of the well region.

Such a semiconductor device is for use in the so-called power supply and control integrated circuit (power control IC), which is suitably used in a voltage regulator, a voltage detector, a DC/DC converter for driving a LCD (liquid crystal display) device, and a driver IC for supplying high voltage power.

BACKGROUND

As the use of power control IC becomes more widespread and its trend proceeds from a single-function IC device such as the voltage regulator and voltage detector to an integrated device such as a large-scale IC, various problems have been encountered as to device requirements.

That is, in addition to the conventional capabilities of driving and controlling circuits at high voltages and large currents, the power control IC has to incorporate various components on board on one single substrate, such as VLSI (very large-scale integration) logical circuits, memory, and CPU (central processing unit).

For use in properly handling high voltages and large currents, DMOS (double-diffused metal-oxide semiconductor) transistor is one of the most important driver devices, and LDMOS (lateral DMOS) transistor in particular is known to be quite suitable for on-board mounting in combination with VLSI circuit.

The LDMOS (lateral DMOS) transistor is characterized primarily by its figure of merit such as transistor withstand voltage and on-resistance.

The transistor withstand voltage is a factor of primary importance for use in power control IC. In conformity with this withstand voltage, the fundamental structure of the transistor is largely determined in terms of (1) the concentration, and the depth of impurities to be disposed in junction regions, and (2) the thickness of gate oxide films, for example.

The on-resistance is a parameter indicative of the capability of driving current per unit area, and its value as small as possible is preferable for the LDMOS transistor.

In concurrence with the abovementioned trend of increasing degree of integration and high voltage capability, the application of the device has widened also to the area of onboard electronic equipments. In that area of the application, severe device requirements have to be fulfilled particularly in harsh electrical environment for controlling ESD (electrostatic discharge) and noises.

In the case when statically-charged human body or object comes into contact with an electrostatic discharge sensitive device, there is a possibility that the electrostatic discharge could be drained through sensitive circuitry in the device. If the electrostatic discharge possesses sufficient energy, damage could occur in the device due to localized overheating. Generally, devices with finer geometries are more susceptible to damage from ESD.

Integrated circuits are therefore sensitive to ESD to some degree. One method employed to protect the circuits is to incorporate a protective resistor between an internal device element and an output terminal to decrease the potential.

This method, however, is not so advantageous for the abovementioned LDMOS transistor which inherently has a low on-resistance, and protective diodes, therefore, have been used previously to protect the elements included in power ICs.

Because of high withstand voltages required for the protective diode, sufficient capabilities of ESD protection can not be achieved by a parasitic diode, but a specific diode has to be formed having a high withstand voltage. This generally forces to set aside relatively large area on the device for forming the diode, which may give rise to an increase in device costs.

In regard to device characteristics of the protective diode, it is desirable for its breakdown voltage to be equal to or higher than a rated voltage of the diode, and equal to or lower than a breakdown voltage of the high withstand voltage device. Also desired is the diode structure which can prevent junction breakdown during extracting the electric charges.

In order to insure such characteristics, the protective diode has been previously formed having impurity diffusion layers with an impurity concentration specifically designed for the diode.

As a result, the process becomes more complicated and the number of process steps increases. Moreover, the diode takes up a relatively large portion of the area of semiconductor device, which results in an undesirable increase in chip size.

One method for obviating the abovementioned difficulties has been disclosed, which will be described briefly herein below.

According to the disclosure, an N-type high voltage region is formed on a P-type semiconductor substrate, an N-type guard ring region is formed on the surface of the semiconductor substrate in the vicinity of the periphery of the N-type well region, and a P-type substrate pickup region is formed opposing to the guard ring region also on the surface of the semiconductor substrate.

Consisting of the thus formed N-type guard ring region, N-type high voltage region, P-type semiconductor substrate, and P-type substrate pickup region, a protective diode is formed. In addition, a breakdown voltage of the protective diode can be adjusted by changing the distance between the guard ring region and the substrate pickup region (Japanese Laid-Open Patent Application No. 2003-17694, for example).

FIG. 20 is a cross-sectional view illustrating a known protective diode, in which there formed are an N-type well region (NW) 104 on a P-type semiconductor substrate (Psub) 102, an N-type guard ring region (N+) 167 on the surface of the semiconductor substrate 102 inside the N-type well region (NW) 104, and a P-type substrate pickup region (P+) 169 on the surface of the semiconductor substrate 102 so as to oppose to the guard ring region 167.

In the method disclosed in the Application No. 2003-17694, however, a drawback with this attempted device structure is that variations in the location resulted from mask positioning, which is performed on the guard ring region 167 and well region 104, affect considerably to the variation of resulting breakdown voltage of the protective diode, and that the withstand voltage is hard to be brought particularly to 40V or lower in a stable (or reproducible) manner.

Although the guard ring region 167 and the substrate pickup region 169 are both formed stably with the self-alignment technique using LOCOS oxide film, the location of the well region 104 may be susceptible to variations through the process step of mask positioning.

Since the degree of overlap between the guard ring region 167 and the well region 104 has a considerable influence on breakdown voltages of the protective diode, the fluctuation in ESD tolerance caused by the variations through mask positioning is a difficulty yet to be solved in spite of the device structure disclosed in the Application No. 2003-17694.

Since the breakdown voltage lower than the rated voltage is not allowed for a protective diode, the breakdown voltage has to be set higher in practice when the variation of the location of the well region 2 through mask positioning is considered. This in turn may bring the breakdown voltage of the protective diode higher than that of the high withstand voltage device. Thus, a further difficulty results in ensuring adequate ESD tolerance.

SUMMARY

This disclosure describes examples of a semiconductor device provided with stable ESD protection capabilities, incorporating a transistor and a protective diode to form a power control IC, which is suitably for use in a voltage regulator, a voltage detector, a DC/DC converter for driving a LCD device, and a driver IC for supplying high voltage power. This disclosure also describes examples of methods for forming such a semiconductor device.

The following description is a synopsis of only selected features and attributes of the present disclosure. A more complete description thereof is found below in the section entitled "Description of the Preferred Embodiments."

In one example, a semiconductor having many of such advantageous features includes:
  a semiconductor substrate of a first conductivity type,
  a well region of a second conductivity type opposite to the first conductivity type, formed in the semiconductor substrate,
  a transistor formed in the well region,
  a guard ring region of the second conductivity type having an impurity concentration higher than the well region, formed on the surface of the semiconductor substrate inside the periphery of, and spatially separated from the boundary of, the well region,
  a substrate pickup region of the first conductivity type having an impurity concentration higher than the semiconductor substrate, formed on the periphery of the well region in contact with the well region and the semiconductor substrate,
  a thick oxide film formed on the surface of the semiconductor substrate between the guard ring region and the substrate pickup region, and
  a protective diode formed of the well region, the guard ring region, and the substrate pickup region.

In addition, the transistor can be an LDMOS transistor which comprises a channel diffusion layer of the first conductivity type, formed in the well region to serve as a drain, and a source of the second conductivity type, formed in the channel diffusion layer, in which the portion of the channel diffusion layer on the surface of the semiconductor substrate immediately under a gate electrode serves as a channel region.

Still in addition, the protective diode can be formed such that the guard ring region and the substrate pickup region are spatially separated from each other, having a rated voltage higher than its nominal rated voltage and a breakdown voltage lower than that of the transistor.

In another example of the disclosure, a semiconductor device is provided having a device structure similar to the semiconductor device mentioned just above, with the exception that a guard ring region of the second conductivity type having an impurity concentration higher than the well region, is formed on the periphery of the well region in contact with the well region and the semiconductor substrate, and a substrate pickup region of the first conductivity type having an impurity concentration higher than the semiconductor substrate, is formed on the surface of the semiconductor substrate outside the periphery of, and spatially separated from the well region.

Moreover, each of the well regions of the abovementioned semiconductor devices may be electrically connected to a source terminal of an apparatus which is configured to supply a source voltage to a peripheral circuit. The transistors and protective diodes of the present disclosure are therefore suitably utilized in a constant voltage generating circuit which is capable of supplying power outputs with improved precision.

BRIEF DESCRIPTION OF THE DRAWINGS

These and other features and advantages of the disclosure will be more clearly seen from the following detailed description which is provided in connection with the accompanying drawings, wherein like reference numerals will be used to refer to like elements, and in which:

FIGS. 1A and 1B illustrate a semiconductor device according to a first embodiment of the disclosure, in which FIG. 1A is a cross-sectional view and FIG. 1B is a top view of the semiconductor device;

FIGS. 5A and 5B are views illustrating a third modification to the first embodiment shown in FIGS. 1A and 1B, in which FIG. 5A is a cross-sectional view and FIG. 5B is a top view of the semiconductor device;

FIGS. 6A and 6B are views illustrating a fourth modification to the first embodiment shown in FIGS. 1A and 1B, in which FIG. 6A is a cross-sectional view and FIG. 6B is a top view of the semiconductor device;

FIGS. 15A and 15B illustrate a semiconductor device according to a second embodiment of the disclosure, in which FIG. 15A is a cross-sectional view, and FIG. 15B is a top view of the semiconductor device;

DETAILED DESCRIPTION OF PREFERRED EMBODIMENTS

Figure 1A:
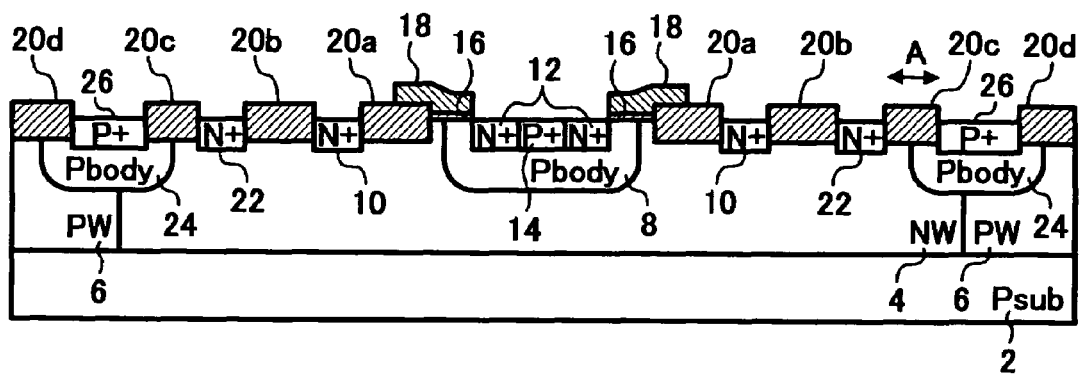

In the detailed description which follows, specific, preferred embodiments of semiconductor devices provided with stable ESD protection capabilities, incorporating a transistor formed inside a well region and a protective diode formed on the periphery of the well region are described. It should be understood, however, that the present disclosure is not limited to these embodiments. For example, it should be appreciated that the present semiconductor device and its structure may also be adaptable to various other devices. Other embodiments will be apparent to those skilled in the art upon reading the following description.

In addition, specific terminology is used in many instances in the description that follows for the sake of clarity. However, the disclosure of this patent specification is not intended to be limited to the specific terminology so selected and it is to be understood that each specific element includes all technical equivalents that operate in a similar manner.

According to a first embodiment of the disclosure, a semiconductor device includes at least a semiconductor substrate, a well region, a transistor, a guard ring region, a substrate pickup region, a thick oxide film, and a protective diode.

In the semiconductor substrate of a first conductivity type, the well region is formed with a second conductivity type opposite to the first conductivity type; the transistor is formed in the well region; the guard ring region of the second conductivity type is formed having an impurity concentration higher than the well region, on the surface of the semiconductor substrate inside the periphery of, and spatially separated from the boundary of, the well region; the substrate pickup region of the first conductivity type is formed having an impurity concentration higher than the semiconductor substrate on the periphery of the well region in contact with the well region and the semiconductor substrate; the thick oxide film is formed on the surface of the semiconductor substrate between the guard ring region and the substrate pickup region; and the protective diode is formed including the well region, the guard ring region, and the substrate pickup region.

The substrate pickup region is formed of a first double-diffusion layer including a low concentration diffusion layer of the first conductivity type having an impurity concentration higher than the semiconductor substrate, formed in a self-aligned manner using the thick oxide film as a mask, and a high concentration diffusion layer of the first conductivity type having another impurity concentration higher than the low concentration diffusion layer.

The transistor is an LDMOS transistor which includes at least a channel diffusion layer of the first conductivity type, formed in the well region, to serve as a drain; and a source of the second conductivity type, formed in the channel diffusion layer, a portion thereof on the surface of the semiconductor substrate immediately under a gate electrode is adapted to serve as a channel region, and the channel region is formed simultaneously with the low concentration diffusion layer.

The transistor may alternatively be an LDMOS transistor which includes at least the channel diffusion layer and the source, in which the LDMOS transistor further includes a drain contact diffusion layer of the second conductivity type, formed in the well region formed contiguously to the guard ring region.

The guard ring region is formed of a second double-diffusion layer, in a self-aligned manner using the thick oxide film as a mask. The second double-diffusion layer consists of a low concentration diffusion layer of the second conductivity type having an impurity concentration higher than the well region, and a high concentration diffusion layer of the second conductivity type having another impurity concentration higher than the low concentration diffusion layer.

The protective diode is formed to have a rated voltage higher than a nominal rated voltage and a breakdown voltage lower than that of the transistor.

The guard ring region and the substrate pickup region are formed spatially separated from each other.

In addition, the transistor is provided with second thick oxide film formed simultaneously with the aforementioned thick oxide film such that a gate electrode is formed to extend covering at least a portion of the second thick oxide film. The second thick oxide film is formed of LOCOS oxide in the disclosure.

The second thick oxide film may alternatively be formed without embedded into the semiconductor substrate, having a cross section approximately of a trapezoidal shape when viewed from thickness direction.

The well region is electrically connected to a source terminal of an apparatus which is configured to supply a source voltage to a peripheral circuit.

The transistors and protective diodes of the present disclosure are therefore suitably utilized in a constant voltage generating circuit which is capable of supplying power outputs with improved precision.

Figure 20:
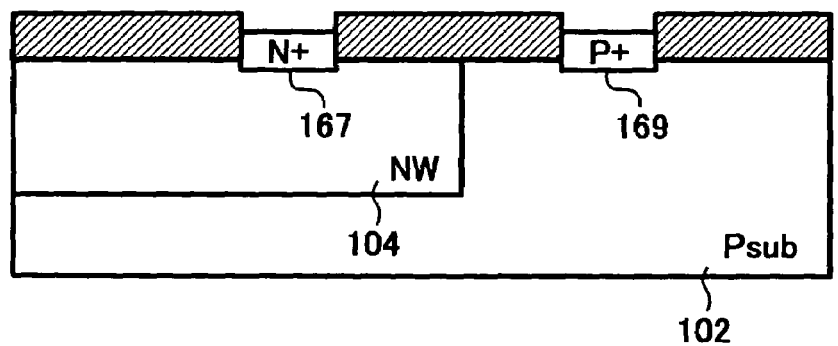
FIG. 20 is a cross-sectional view illustrating a known protective diode.

It may be noted that, in the aforementioned known semiconductor device of FIG. 20, P-type substrate pickup region 169 is formed directly on the surface of the semiconductor substrate, and this structure has been encountered with relative ease by a difficulty of the junction breakdown during extracting the electric charges. In this case, the P-type substrate pickup region 169 is formed in the diffusion layer which is disposed simultaneously with source and drain regions (not shown) of the transistor.

This difficulty is considered due to the fact that the diffusion layer for the source and drain regions is formed with a junction having a relatively shallow and dense impurity profile with the increase in miniaturization of other transistors in peripheral area and that the portion of the semiconductor substrate 2 surrounding the well region 4 is formed having a low impurity concentration (i.e., high resistance).

By contrast, in the semiconductor device according to the first embodiment of the disclosure (FIG. 1A), the substrate pickup region is formed so as to include a first double-diffusion layer including a low concentration diffusion layer of the first conductivity type having an impurity concentration higher than the semiconductor substrate, formed in a self-aligned manner using the thick oxide film as a mask; and a high concentration diffusion layer of the first conductivity type having another impurity concentration higher than the low concentration diffusion layer.

In addition, in the case when the transistor is an LDMOS transistor which includes at least a channel diffusion layer of the first conductivity type, formed in the well region, to serve as a drain; and a source of the second conductivity type, formed in the channel diffusion layer, a portion thereof on the surface of the semiconductor substrate immediately under a gate electrode is adapted to serve as a channel region; and the channel region may preferably be formed simultaneously with the low concentration diffusion layer.

The transistor may alternatively be an LDMOS transistor which includes at least the channel diffusion layer and the source, in which the LDMOS transistor further includes a drain contact diffusion layer of the second conductivity type, formed in the well region formed contiguously to the guard ring region.

Moreover, the guard ring region may be formed so as to include another double-diffusion layer, in a self-aligned manner using the thick oxide film as a mask, including a low concentration diffusion layer of the second conductivity type having an impurity concentration higher than the well region, and a high concentration diffusion layer of the second conductivity type having another impurity concentration higher than the low concentration diffusion layer.

According to a second embodiment of the disclosure, another semiconductor device is provided so as to have a device structure similar to that of the semiconductor device mentioned earlier according to the first embodiment, with the exception that a guard ring region of the second conductivity type having an impurity concentration higher than the well region, is formed on the periphery of the well region in contact with the well region and the semiconductor substrate; and a substrate pickup region of the first conductivity type having an impurity concentration higher than the semiconductor substrate, is formed on the surface of the semiconductor substrate outside the periphery of, and spatially separated from the well region.

In addition, the transistor is an LDMOS transistor, which includes at least a channel diffusion layer of the second conductivity type, formed in the well region, a portion thereof on the surface of the semiconductor substrate immediately under a gate electrode is adapted to serve as a channel region; a low impurity concentration drain of the first conductivity type, formed in the well region on the surface of the semiconductor substrate in contact with the channel diffusion layer; a source of the first conductivity type, formed in thee: channel diffusion layer; and a drain contact diffusion layer of the first conductivity type, formed in the low impurity concentration drain, in which the channel region is formed simultaneously with the guard ring region.

Having described the present disclosure in general, several preferred embodiments of the semiconductor device will be described herein below according to the present disclosure with reference to FIGS. 1 through 18.

Figure 1B:
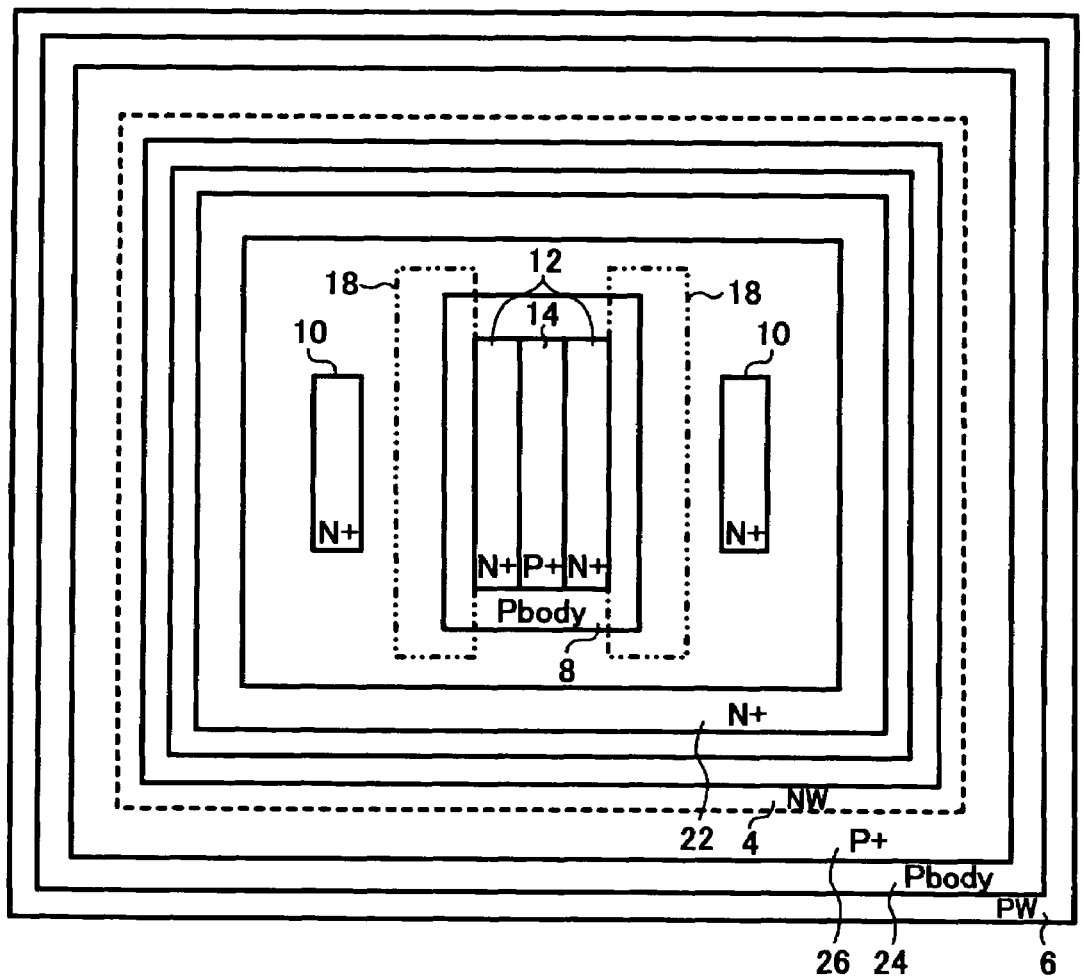

FIGS. 1A and 1B illustrate a semiconductor device according to a first embodiment of the disclosure, in which FIG. 1A is a cross-sectional view and FIG. 1B is a top view of the semiconductor device.

Although only the regions for forming an N-channel type LDMOS (lateral diffusion MOS) transistor and protective diodes are shown in FIGS. 1A and 1B, it may be noted that other device components including CMOS (complimentary MOS) transistors and other elements are also included in the device.

Referring to FIGS. 1A and 1B, an N-type well region (NW) 4 for forming an LDMOS is formed on a P-type semiconductor substrate (Psub) 2. In the region other than the N-well region on the substrate, a P-type well region (PW) 6 is formed. The N-well region 4 in the present embodiment constitutes a drain for the LDMOS transistor.

A P-type channel diffusion layer (Pbody) 8 and an N-type drain (N+) 10 are formed spatially separated with each other in the N-well region 4.

In addition, there formed in the P-channel diffusion layer 8 are an N-type source (N+) 12 and a P-type channel diffusion pickup region (P+) 14 which is placed in the region opposite to N-drain 10 with respect to the N-source 12.

A gate electrode 18 is formed between N-source 12 and N-drain 10 on the semiconductor substrate 2 with an underlying gate oxide layer 16.

This gate electrode 18 is formed so as to overlie the gate oxide layer 16 and to extend covering a portion of LOCOS (local oxidation of silicon) oxide layer 20a which is formed on the N-well region 4 between P-channel diffusion layer 8 and N-type drain 10 spatially separated from the diffusion layer 8.

In addition, one of the sides of the gate electrode 18 facing N-drain 10 is formed spatially separated from the N-drain 10 by the interposing portion of the LOCOS oxide layer 20a.

The P-channel diffusion layer 8 and N-source 12 are both formed in the self-aligned manner with respect to the side of gate electrode 18 facing the N-source 12.

In the thus configured LDMOS transistor, the surface region of P-channel diffusion layer 8 immediately below the gate electrode 18 constitutes a channel region.

Surrounding LDMOS transistor forming region, an N-type guard ring region 22 is formed in the shape of a frame inside the periphery of, and spatially separated from a boundary of, the N-well region 4.

The N-type guard ring region 22 has an N-type impurity concentration higher than the N-well region 4.

Another LOCOS oxide layer 20b is formed on the N-well region 4 between N-type guard ring region 22 and N-type drain 10. The N-type guard ring region 22 is formed using LOCOS oxide layers 20b and 20c, as a mask.

Surrounding the N-type guard ring region 22, a P-type low concentration diffusion layer (Pbody) 24 is formed in the shape of a frame on the periphery of the N-well region 4 in contact with both N-well region 4 and P-well region 6. The P-type low concentration diffusion layer 24 has an impurity concentration higher than P-well region 6.

In addition, a P-type high concentration diffusion layer (P+) 26 is formed frame-shaped in the P-type low concentration diffusion layer 24. The P-type high concentration diffusion layer 26 has an impurity concentration higher than P-type low concentration diffusion layer 24.

The P-type low concentration diffusion layer 24 and P-type high concentration diffusion layer 26 constitute a substrate pickup region in the semiconductor device of the first embodiment.

The aforementioned LOCOS oxide layer 20c is formed between N-type guard ring region 22 and P-type high concentration diffusion layer 26 on the surface region of N-well region 4 and P-type low concentration diffusion layer 24.

A LOCOS oxide layer 20d is formed on the surface region of P-well region 6 and P-type low concentration diffusion layer 24 opposite to N-type guard ring region 22 with respect to P-type high concentration diffusion layer 26.

The P-type low concentration diffusion layer 24 and P-type high concentration diffusion layer 26 are formed using LOCOS oxide layers 20c and 20d, as a mask.

Surrounding the N-channel LDMOS forming region, a protective diode is formed of N-type guard ring region 22, N-well region 4, P-type low concentration diffusion layer 24, and P-type high concentration diffusion layer 26.

FIGS. 2A through 2E are cross-sectional views illustrating the semiconductor device during various stages in the fabrication process according to the first embodiment of the disclosure. This fabrication process relates primarily to the formation of a 35V protective diode in combination with LDMOS transistor rated at 30V.

Although CMOS transistors are also formed during the process for use in peripheral circuits in addition to the LDMOS transistor, the description on the CMOS process is herein abbreviated for purposes of clarity.

The fabrication process will be described herein below in reference to FIGS. 1A through 2E.

(1) A silicon oxide film is formed by thermal oxidation on the surface of a P-type semiconductor substrate 2 having a thickness of about 25 mn.

A first resist film is then formed by the photolithography method to expose the region where an N-well is to be formed. With the use of thus prepared first resist film as a mask, phosphorus ions as N-type impurities are implanted under the conditions of an acceleration voltage of about 30 keV and a dose of $(2.0\text{\textasciitilde}4.0)\times10^{13}$ cm$^{-2}$.

Subsequent to the removal of the first resist film, a second resist film is formed to expose a P-well forming region. Using the second resist film as a mask, boron ions as P-type impurities are implanted under the conditions of an acceleration voltage of about 30 keV and a dose of about $1.0\times10^{13}$ cm$^{-2}$.

After removing the second resist film, the structure is subjected to a thermal diffusion process at about 1150° C. to form N-well region 4 having a surface impurity concentration of $(4.0\text{\textasciitilde}8.0)\times10^{15}$ phosphorus ions/cm$^{-3}$ and a depth of (4~6) μm, and P-well region 6.

Figure 2A:
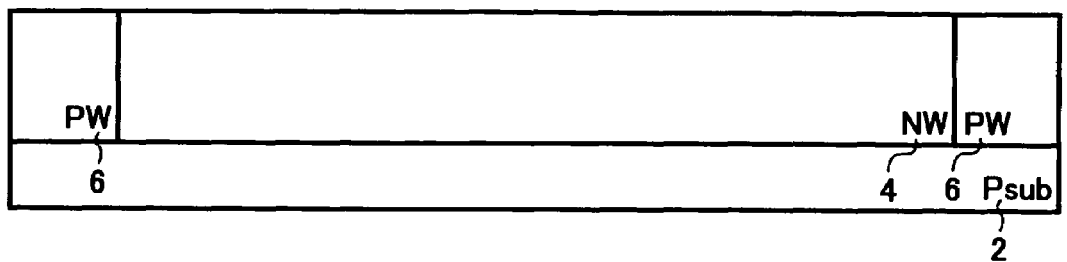
FIGS. 2A through 2E are cross-sectional views illustrating the semiconductor device during various stages in the fabrication process according to the first embodiment of the disclosure.

The surface impurity concentration, and the diffusion depth of N-well region 4 are suitably optimized according to a withstand voltage of the LDMOS transistor to be formed. In addition, the surface impurity concentration of the P-well region 6, as the portion other than the N-well region 4, is optimized according to the characteristics of peripheral Nch transistors to be loaded in combination. (FIG. 2A)

(2) Subsequent to the removal of the silicon oxide film from the surface of the semiconductor substrate 2, another silicon oxide film is formed by thermal oxidation having a thickness of about 25 mn.

In addition, a silicon nitride film is disposed thereon by LP-CVD (low pressure-chemical vapor deposition) method and the structure is subjected to a patterning process with photolithography and etching techniques such that only the portions of the silicon nitride film overlying active regions are left un-removed.

After performing an implantation for preventing the parasitic MOS channel conduction, a relatively thick oxide film is grown at about 1000° C. to a thickness ranging from 600 to 800 nm, whereby LOCOS oxide films 20a, 20b, 20c, and 20d are formed.

Figure 2B:
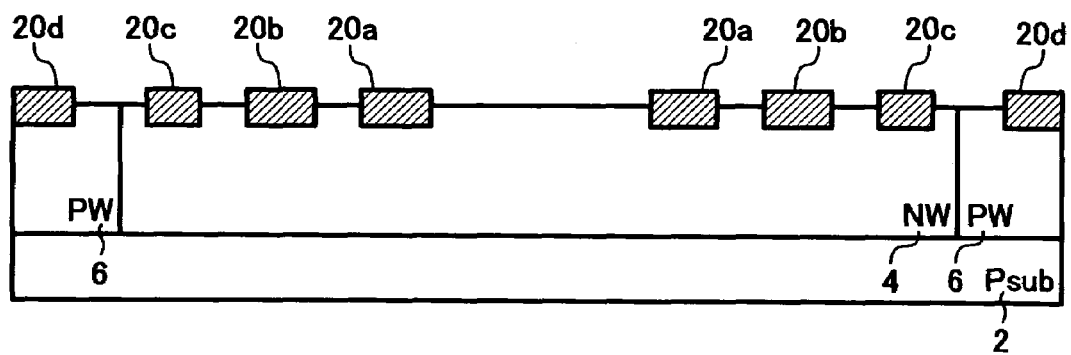

Thereafter, both the silicon nitride film and the underlying silicon oxide film are removed. (FIG. 2B)

Figure 2C:
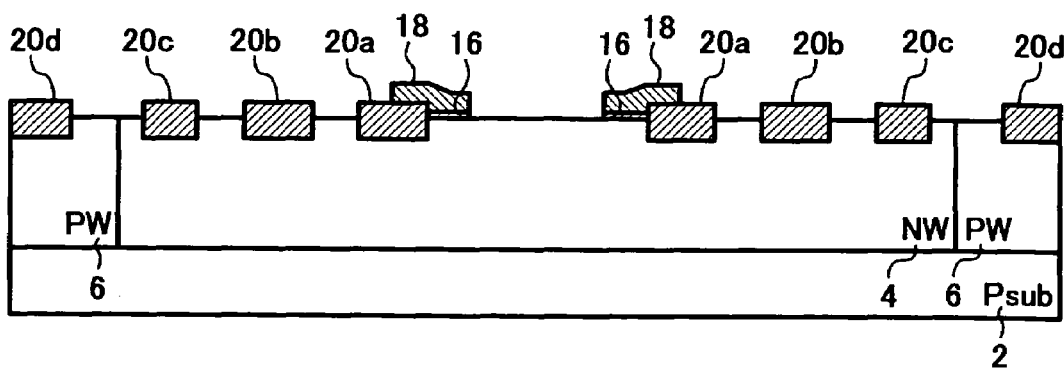

(3) After growing a gate oxide layer 16 by thermal oxidation to a thickness of about 25 nm, a polysilicon film is formed thereon by CVD method, phosphorus ions as N-type impurities are diffused into the polysilicon film to a relatively high concentration to form an N+ polysilicon film, and the structure is subjected to a patterning process to form a predetermined shape with photolithography and etching techniques, whereby gate electrodes 18, 18 are formed (FIG. 2C).

(4) A P-channel diffusion layer to serve as the channel of the LDMOS transistor is formed by implanting boron ions as P-type impurities using the gate electrodes 18, 18 as a mask and by performing a thermal diffusion process.

The amount of implantation, and thermal diffusion of the ions are optimized according to withstand, and threshold voltages of the LDMOS transistor to be formed.

The P-channel diffusion layer 8 is formed in the present embodiment by implanting ions of about $3.5\times10^{13}$ cm$^{-2}$ and thermally diffusing at about 1100° C. for about 120 minutes.

Simultaneously, a P-type low concentration diffusion layer 24 is formed in the region, where a protective diode is to be formed, in the self-aligned manner using LOCOS oxide layers 20c and 20d, as a mask.

Figure 2D:
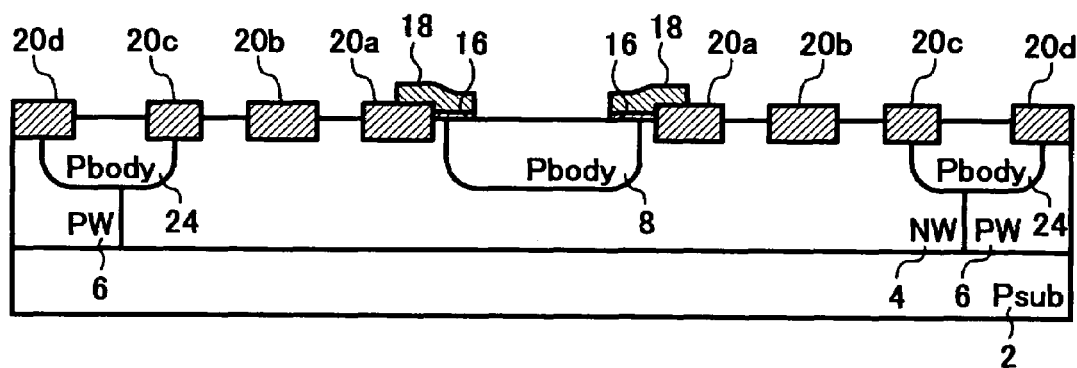

The P-type low concentration diffusion layer 24 is formed on the periphery of the N-well region 4, having an impurity concentration approximately equal to that of the lower concentration portion in the double-diffusion layer in the substrate pickup region 8. (FIG. 2D)

(5) N-type drain 10, N-type source 12, and N-type guard ring region 22 are formed simultaneously with forming sources and drains of CMOS transistors included in peripheral circuits. This is carried out by implanting arsenic ions as N-type impurities to a high concentration using a resist layer and LOCOS oxide films 20a, 20b, and 20c, as masks; and subjecting the structure to heat treatment at about 950° C.

Figure 2E:
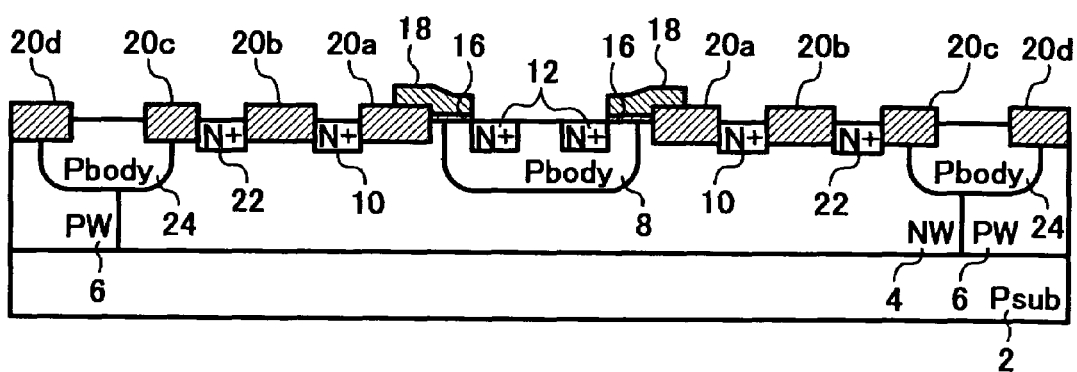

The N-type drain 10 is formed using LOCOS oxide layers 20a and 20b, as a mask; the N-type source 12 is formed in the self-aligned manner with respect to the gate electrode 18; and the N-type guard ring region 22 is formed using LOCOS oxide layers 20b and 20c, as a mask. (FIG. 2E)

(6) Subsequently formed are the P-type channel diffusion pickup region. (P+) 14 in P-channel diffusion layer 8 and the P-type high concentration diffusion layer 26 in P-type low concentration diffusion layer 24, by implanting BF$_2$ for creating P-type impurities to a relatively high concentration using a resist layer and LOCOS oxide films 20c and 20d, as masks, and subjecting the structure to heat treatment at about 900° C. (FIG. 1)

The above noted heat treatments may be performed in combination with a reflow process of BPSG (boro-phosphosilicate glass) film, which is to be carried out afterward for forming interlayer insulators.

Conventional CMOS process steps (not shown) will follow for completing the device fabrication such as forming the interlayer insulators of BPSG film, contact holes for electrical connection and wiring, and passivating films, among others.

In the configuration of the semiconductor device of the first embodiment illustrated in FIGS. 1A and 1B, the junction between the P-well region 6, P-type low concentration diffusion layer 24 as a pickup region for the substrate, and N-well region 4, is situated under the P-type low concentration diffusion layer 24 (substrate pickup region).

As a result, the dispersion in the threshold voltage of protective diodes, which is caused by the positional variation of N-well region 4 through mask positioning, can be decreased, and the value of threshold voltage can suitably be adjusted by changing the distance between the N-type guard ring region 22 and the substrate pickup region including P-type low concentration diffusion layer 24 and P-type high concentration diffusion layer 26.

In addition, since the N-type guard ring region 22, P-type low concentration diffusion layer 24, and P-type high concentration diffusion layer 26 are all formed using the LOCOS oxide layer 20c as a mask, the distance between the N-type guard ring region 22 and either the P-type low concentration diffusion layer 24 or the P-type high concentration diffusion layer 26 is formed as predetermined without being much affected by the deviation in the location resulted from mask positioning, whereby the protective resistor can be formed having a stable or reproducible withstand voltage.

Figure 3:
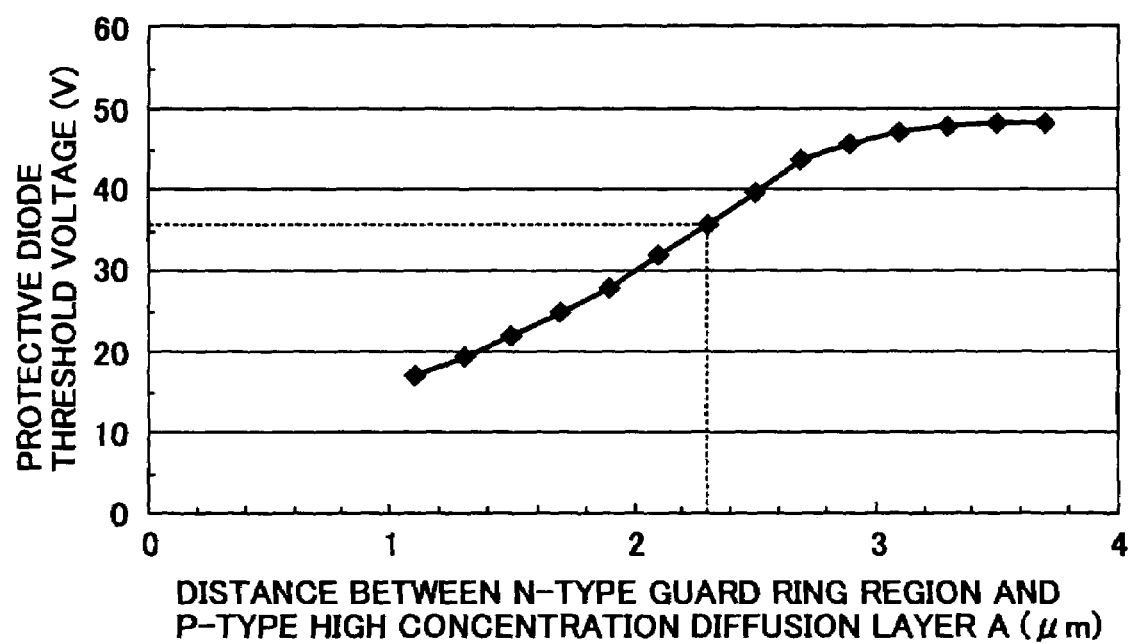
FIG. 3 shows a plot of the withstand voltage, vertically, versus size A of the LOCOS oxide layer which is placed between the N-type guard ring region and the P-type high concentration diffusion layer, horizontally, for the protective resistor of FIG. 1.

FIG. 3 plots the withstand voltage (V), vertically, versus the size A(μm) of the LOCOS oxide layer 22c which is placed between the N-type guard ring region and the P-type high concentration diffusion layer, horizontally, for a protective resistor formed according to the first embodiment of the disclosure (FIG. 1).

Since the withstand voltage of LDMOS transistor is typically about 46 V, the protective resistor with 30 V product rating can suitably be used in combination by adjusting its withstand voltage as low as possible within the range from 30 to 46 V in inclusive of quality dispersion.

From the results shown in FIG. 3 (designated with broken lines), this withstand voltage of the protective resistor can be achieved by preferably setting the size A of the LOCOS oxide layer 22c to be 2.3 μm between the N-type guard ring region and the P-type high concentration diffusion layer.

That is, by setting the size A as (2.3±0.2) μm including the dispersion during production, the protective resistor can be formed having breakdown voltages in the range of 32~39 V.

As a result, since the breakdown voltage of the protective resistor can be adjusted, while ensuring the 30 V product rating, to be lower than the withstand voltage of LDMOS transistor, the charges, which are accumulated in the drain of LDMOS transistor by either ESD (electrostatic discharge) or electric noise, can be removed with efficiency, whereby the damages can be prevented of the LDMOS transistor and other devices connected thereto.

In the case when the rated voltage or LDMOS withstand voltage changes, a measure can be worked out for forming protective diodes provided with desirable breakdown voltages by optimizing through modification without supplementing particular process steps.

In addition, the LOCOS oxide films are used as thick oxide films in the present embodiment, and the process for forming the LOCOS films has excellent dimensional controllability. As a result, the dispersion in the threshold voltage of protective diodes can be decreased.

Moreover, since the LOCOS oxide layer 20a in the LDMOS transistor is provided under the drain side of gate electrode 18, the drain withstand voltage can be increased for the LDMOS transistor.

In addition, the substrate pickup region is formed of a double-diffusion layer including P-type low concentration diffusion layer 24 having a P-type impurity concentration higher than P-type semiconductor substrate 2 and P-type high concentration diffusion layer 26 having a P-type impurity concentration higher than P-type low concentration diffusion layer 24.

As a result, the junction breakdown can be prevented during extracting the electric charges. For example, since the P-type low concentration diffusion layer 24 is formed by the abovementioned method having a sheet resistance of as low as ranging from 300 to 700 (Ω/□) and an impurity depth as deep as ranging from 1.0 to 1.5 μm, the junction breakdown during extracting the electric charges can be prevented, as a result.

Still in addition, since the P-type low concentration diffusion layer 24 is formed simultaneously with the P-channel diffusion layer 8, the former layer can be formed without increasing the number of process steps.

Moreover, since the protective diode is formed on the entire outer circumference of the LDMOS transistor forming region in the present embodiment, a-particular region, which is otherwise required with relatively large area, is not necessary for forming the protective diode.

By contrast to the structure mentioned just above, the protective diode may not necessarily be formed on the entire outer circumference of the LDMOS transistor forming region, and may alternatively be formed as will be herein below.

Figure 4A:
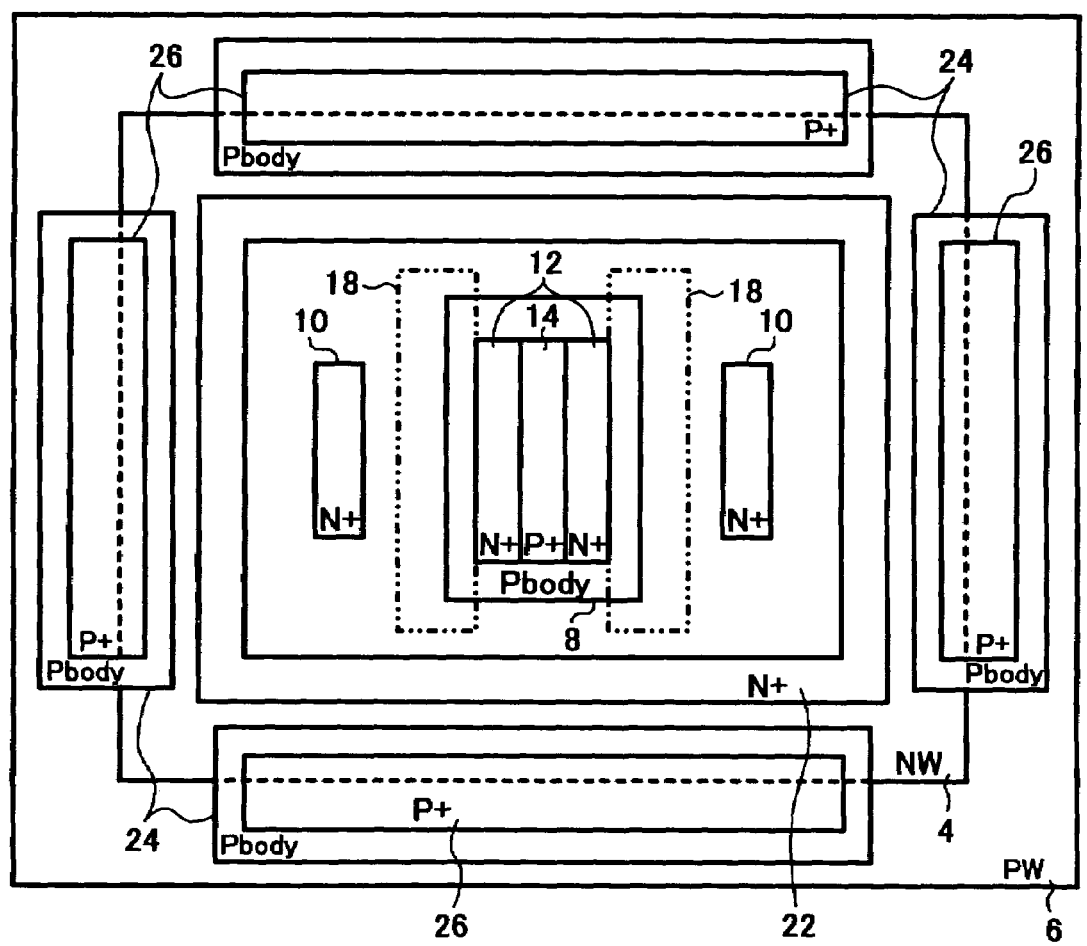
FIG. 4A is a top view illustrating a first modification to the first embodiment shown in FIGS. 1A and 1B.
Figure 4B:
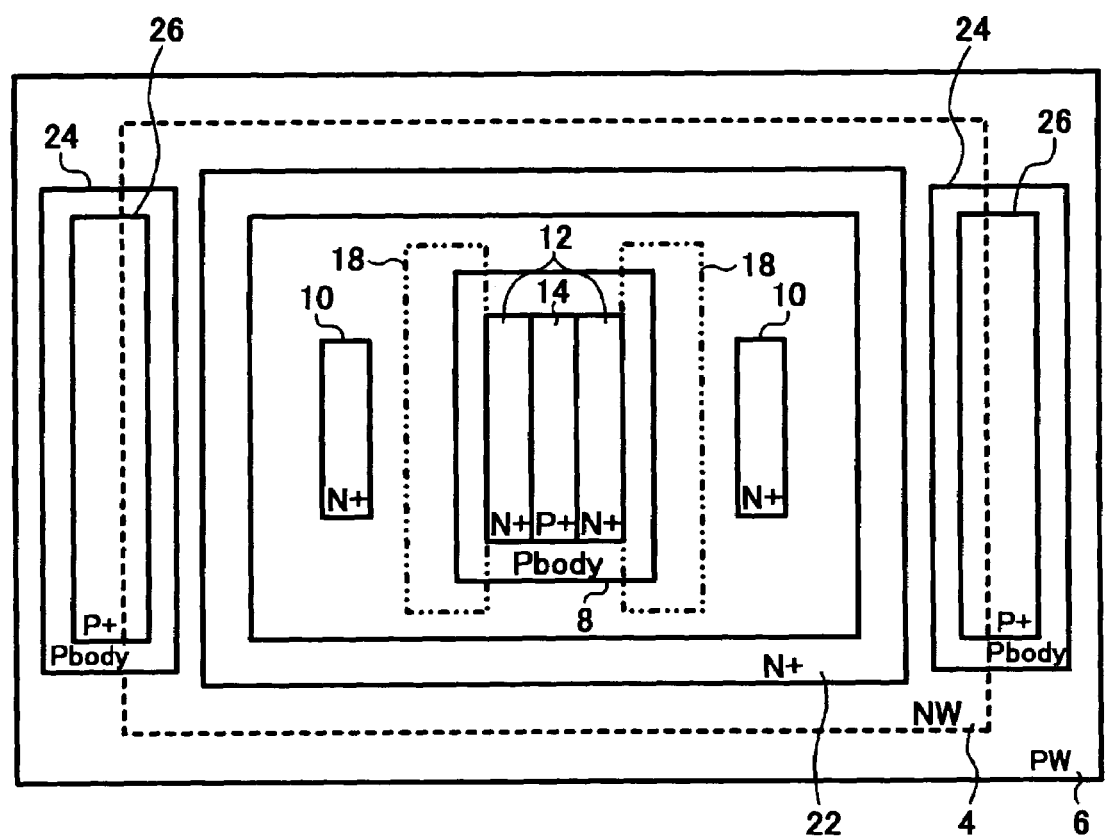
FIG. 4B is a top view illustrating a second modification to the first embodiment shown in FIGS. 1A and 1B.

For example, first and second modifications to the first embodiment with respect to the protective diode formation are illustrated in FIGS. 4A and 4B, respectively.

Referring to FIG. 4A, the protective diode according to the first modification to the first embodiment may be formed such that the portions of the P-type low concentration diffusion layer 24 and P-type high concentration diffusion layer 26, as constituent layers of the substrate pickup region, be disposed corresponding to the four sides of the quadrilateral N-well region 4.

Alternatively, as shown in FIG. 4B, the protective diode according to the second modification may be formed such that the portions of the P-type low concentration diffusion layer 24 and P-type high concentration diffusion layer 26 be disposed corresponding to two opposing sides of the quadrilateral N-well region 4.

Still in addition, the protective diode may alternatively be formed such that one portion of the P-type low concentration diffusion layer 24 and P-type high concentration diffusion layer 26 is disposed corresponding to one side of the N-well region 4.

Thus, the location for providing the protective diode in the semiconductor device may be selected arbitrarily such as, for example, on the portion of the outer circumference of the LDMOS transistor forming region.

Figure 5A:
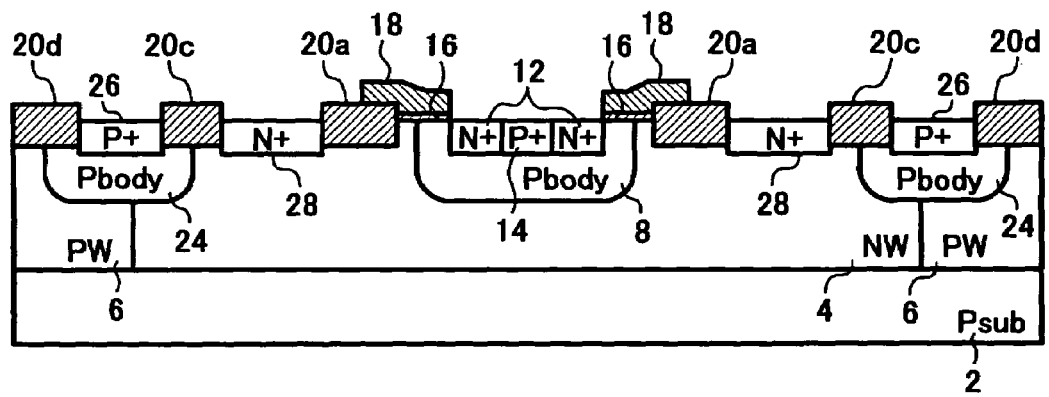
Figure 5B:
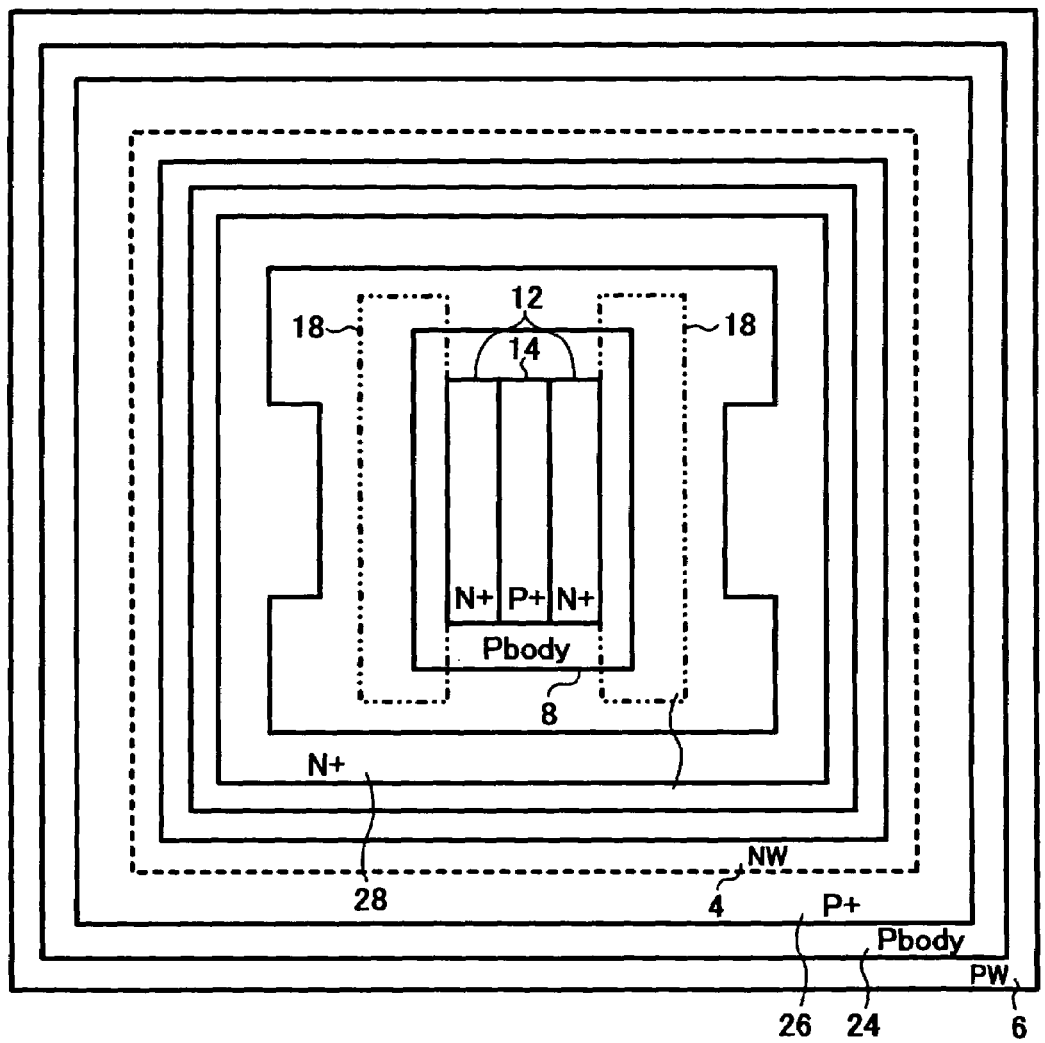

The N-type drain 10 is formed in the abovementioned structures spatially separated from the N-type guard ring region 22. Alternatively, as illustrated in FIGS. 5A and 5B, the protective diode may be formed according to a third modification such that the N-type drain 10 and the N-type guard ring region 22 are connected with each other in the channel length direction to form a single N-type diffusion layer (N+) 28.

Figure 6A:
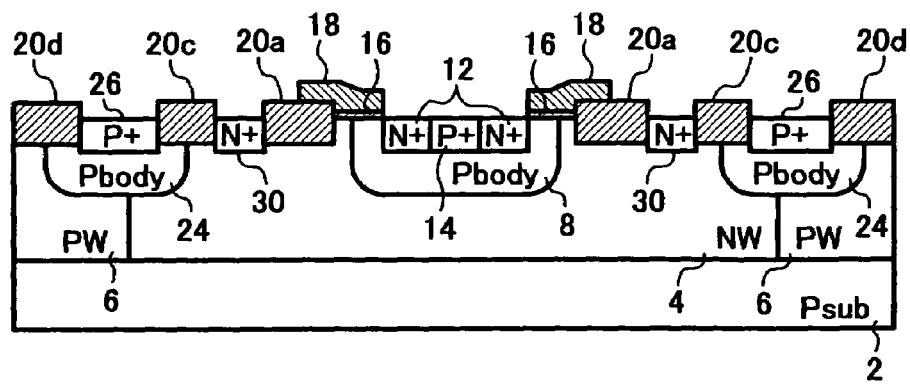
Figure 6B:
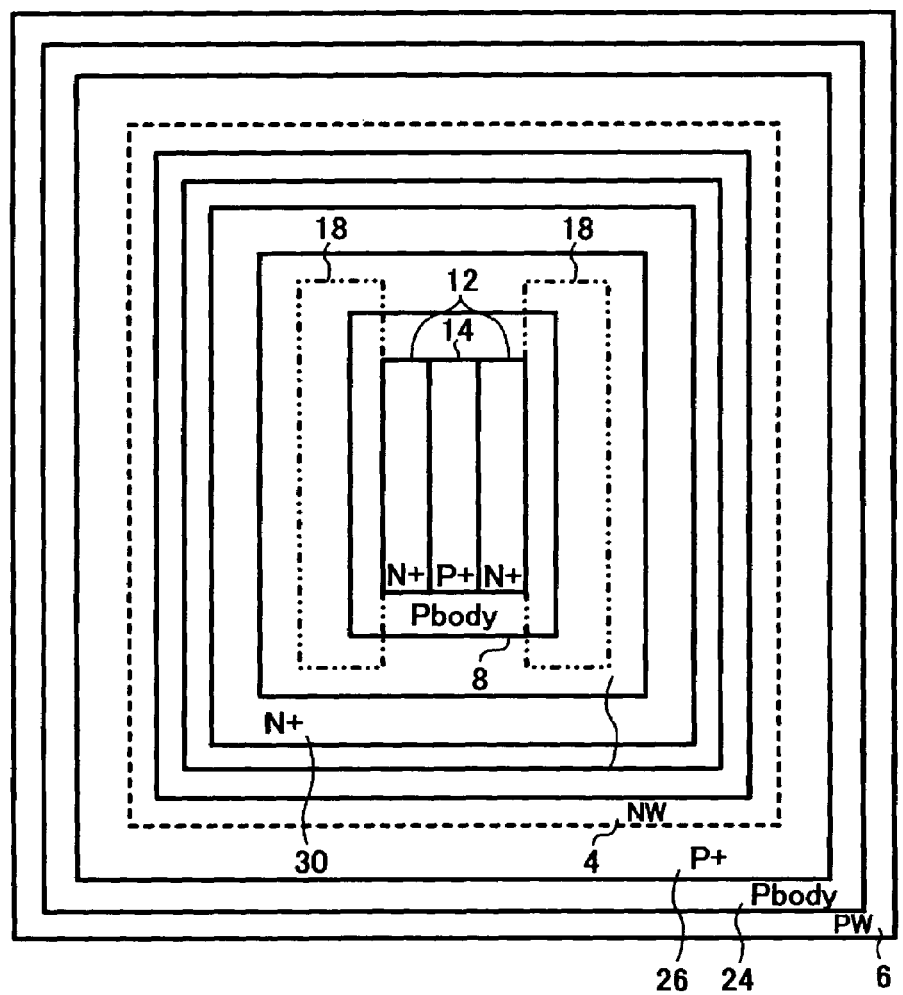

Still in addition, the protective diode may alternatively be formed according to a fourth modification such that the N-type drain 10 and the N-type guard ring region 22 are connected to form a further N-type diffusion layer (N+) 30, as shown in FIGS. 6A and 6B.

By forming the LDMOS transistor with a connected N-type drain and N-type guard ring region, as mentioned above, the area taken by the LDMOS transistor and the protective transistor decreases, which in turn reduces the chip area of the semiconductor device.

Also in the abovementioned structures, the LOCOS oxide films 20a, 20b, 20c, and 20d are formed for use in thick oxide film.

Figure 7:
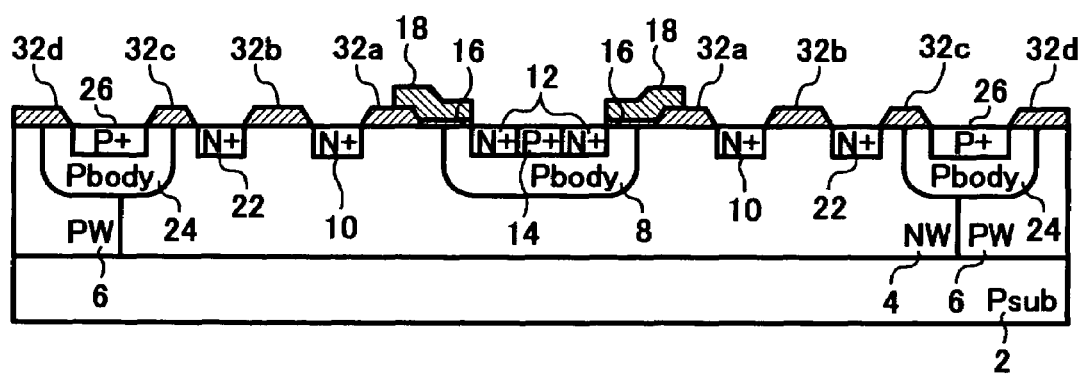
FIG. 7 is a cross-sectional view illustrating a fifth modification to the first embodiment shown in FIGS. 1A and 1B.

Alternatively, as illustrated in FIG. 7, the structure of the semiconductor device according to a fifth modification may be formed such that thick oxide films 32a, 32b, 32c, and 32d are provided in place of the LOCOS oxide films 20a, 20b, 20c, and 20d, each in the shape of a trapezoid when viewed from thickness direction without embedded into the semiconductor substrate 2.

These thick oxide films 32a, 32b, 32c, and 32d are formed by disposing an oxide film to a thickness ranging from 300 to 500 nm over the entire surface of the semiconductor substrate 2 and by performing a patterning process to form predetermined shapes by photolithography and etching techniques.

By using the thick oxide films 32a, 32b, 32c, and 32d in the LDMOS transistor according to the present structure, the transistor can be formed having a decreased on-resistance compared with the case of the LOCOS oxide films.

Figure 8:
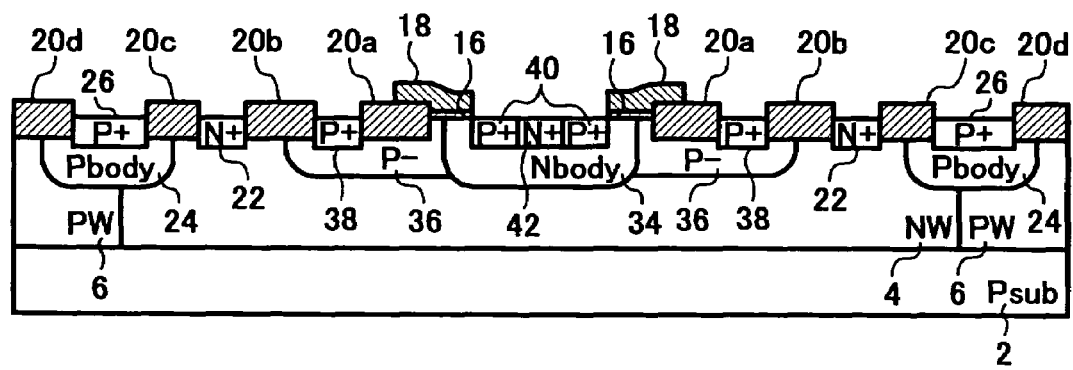
FIG. 8 is a cross-sectional view illustrating a sixth modification to the first embodiment shown in FIGS. 1A and 1B.

FIG. 8 is a cross-sectional view illustrating a semiconductor device according to a sixth modification to the first embodiment of the disclosure.

Although only the regions for forming a P-channel type LDMOS transistor and protective diodes are shown in FIG. 8, it may be noted that other device components including CMOS transistor and other elements are also included in the device.

The components in the semiconductor device of FIG. 8 that are similar to those of the device described earlier in reference to FIG. 1A are shown with identical numerical representations.

Referring to FIG. 8, an N-type well region (NW) 4 and a P-type well region (PW) 6 are formed on a P-type semiconductor substrate (Psub) 2.

An N-type channel diffusion layer (Nbody) 34 and a P-type low concentration drain (P−) 36 are formed adjacent to each other in the N-well region 4.

A P-type drain (P+) 38 is formed in the P-type low concentration drain (P−) 36.

In addition, there formed in the N-type channel diffusion layer 34 are a P-type source (P+) 40 and an N-type channel diffusion pickup region (N+) 42 which is placed in the region opposite to P-drain 38 with respect to the P-type source 40.

A gate electrode 18 is formed between P-source 40 and P-drain 38 on the semiconductor substrate 2 with an underlying gate oxide layer 16.

This gate electrode 18 is formed so as to overlie the gate oxide layer 16 and to extend covering the portion of LOCOS oxide layer 20a which is formed on the surface of P-type low concentration drain 36 between N-channel diffusion layer 34 and P-type drain 38 spatially separated from the diffusion layer 34.

One of the sides of the gate electrode 18 facing P-drain 38 is formed spatially separated from the P-drain 38 by the interposing portion of the LOCOS oxide layer 20a.

The N-channel diffusion layer 34 and P-source 40 are both formed in the self-aligned manner with respect to the side of gate electrode 18 facing the P-source 40.

In the thus configured LDMOS transistor, the surface region of N-channel diffusion layer 34 immediately below the gate electrode 18 constitutes a channel region.

Surrounding the LDMOS transistor forming region, an N-type guard ring region 22 is formed in the shape of a frame inside the periphery of, and spatially separated from a boundary of, the N-well region 4.

Another LOCOS oxide layer 20b is formed on the N-well region 4 between N-type guard ring region 22 and P-drain 38.

Surrounding the N-type guard ring region 22, a P-type low concentration diffusion layer (Pbody) 24 is formed in the shape of a frame on the periphery of the N-well region 4 in contact with both N-well region 4 and P-well region 6.

In addition, a P-type high concentration diffusion layer (P+) 26 is formed frame-shaped in the P-type low concentration diffusion layer 24.

A LOCOS oxide layer 20c is formed between N-type guard ring region 22 and P-type high concentration diffusion layer 26 on the surface region of N-well region 4 and P-type low concentration diffusion layer 24.

Another LOCOS oxide layer 20d is formed on the surface region of P-well region 6 and P-type low concentration diffusion layer 24 opposite to N-type guard ring region 22 with respect to P-type high concentration diffusion layer 26.

Surrounding the P-channel LDMOS forming region, a protective diode is formed of N-type guard ring region 22, N-well region 4, P-type low concentration diffusion layer 24, and P-type high concentration diffusion layer 26.

FIGS. 9A through 9E are cross-sectional views illustrating the semiconductor device during various stages in the fabrication process according to the sixth modification to the first embodiment of the disclosure. This fabrication process relates primarily to the formation of a 58V protective diode in combination with LDMOS transistor rated at 50V.

Although CMOS transistors are also formed during the process for use in peripheral circuits in addition to the LDMOS transistor, the description on the CMOS process is herein abbreviated for purposes of clarity.

Figure 9A:
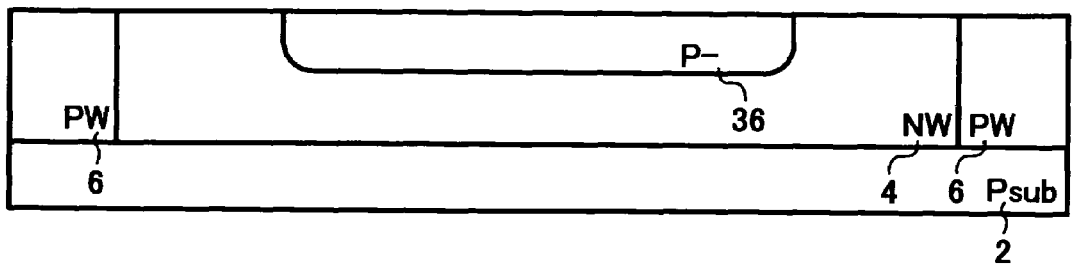
FIGS. 9A through 9E are cross-sectional views illustrating the semiconductor device during various stages in the fabrication process according to the sixth modification shown in FIG. 8.
Figure 9B:
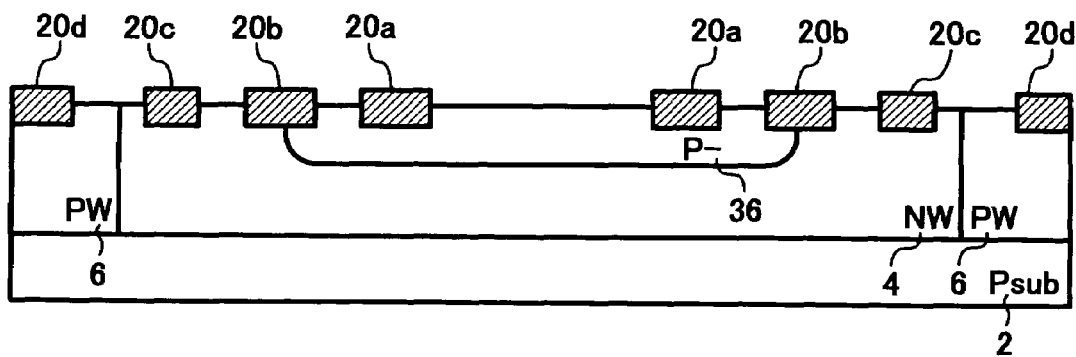

The fabrication process will be described herein below in reference to FIGS. 8 through 9E.

(1) A silicon oxide film is formed by thermal oxidation on the surface of a P-type semiconductor substrate 2 having a thickness of about 25 mn.

A first resist film is then formed by the photolithography method to expose the region where an N-well is to be formed. With the use of thus prepared first resist film as a mask, phosphorus ions as N-type impurities are implanted under the conditions of an acceleration voltage of about 150 keV and a dose of $(2.0\sim4.0)\times10^{12}$ cm$^{-2}$.

Subsequent to the removal of the first resist film, a second resist film is formed to mask the N-well forming region. Using the second resist film as a mask, boron ions as P-type impurities are implanted under the conditions of an acceleration voltage of about 30 keV and a dose of about $1.0\times10^{13}$ cm$^{-2}$.

After removing the second resist film, the structure is subjected to heat treatment at about 1180° C. to form N-well region 4 having a surface impurity concentration of $(3.0\sim7.0)\times10^{15}$ phosphorus ions/cm$^{-3}$ and a depth of (9~13) μm, and P-well region 6.

The surface impurity concentration, and the diffusion depth of N-well region 4 are suitably optimized according to a withstand voltage of the LDMOS transistor to be formed. In addition, the surface impurity concentration of the P-well region 6, as the portion other than the N-well region 4, is optimized according to the characteristics of peripheral Nch transistors to be loaded in combination.

Subsequent to the removal of the silicon oxide film from the surface of the semiconductor substrate 2, another silicon oxide film is formed by thermal oxidation having a thickness of about 25 mn.

Another ion implantation is performed into LDMOS transistor forming region with boron ions under the conditions of an acceleration voltage of about 30 keV and a dose of $(4.0\sim6.0)\times10^{13}$ cm$^{-2}$, which is followed by heat treatment at about 1100° C. to form P-type low concentration drain 36. (FIG. 9A).

(2) A silicon nitride film is disposed by LP-CVD method and subjected to a patterning process with photolithography and etching techniques such that only the portions of the silicon nitride film overlying active regions are left un-removed.

After performing another implantation for preventing the parasitic MOS channel conduction, a relatively thick oxide film is grown at about 1000° C. to a thickness ranging from 600 to 800 nm, whereby LOCOS oxide films 20a, 20b, 20c, and 20d are formed.

Thereafter, both the silicon nitride film and the underlying silicon oxide film are removed. (FIG. 9B)

Figure 9C:
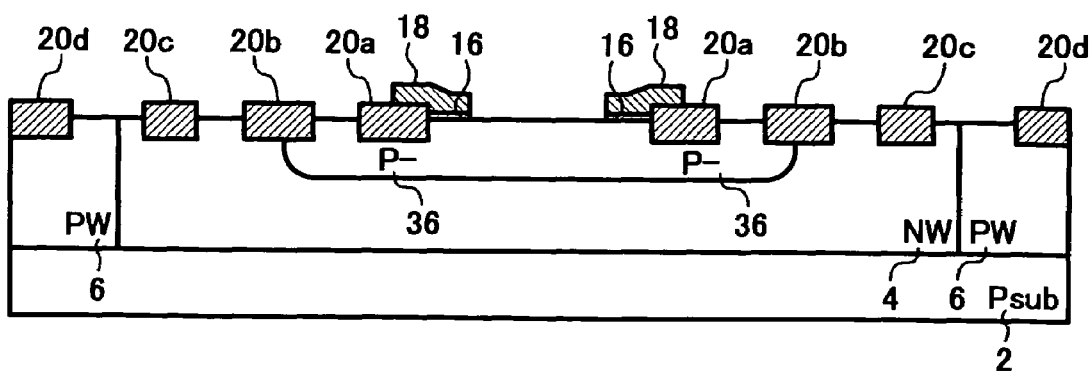

(3) Both the silicon nitride film and the underlying silicon oxide film, which were used for forming the LOCOS oxide films, are removed; a gate oxide layer 16 is formed by thermal oxidation to a thickness of about 40 nm; a polysilicon film is formed thereon by CVD method; and the structure is subjected to a patterning process to form a predetermined shape with photolithography and etching techniques; whereby gate electrodes 18, 18 are formed (FIG. 9C).

(4) In order to form an N-channel diffusion layer to serve as the channel of the LDMOS transistor, phosphorus ions as N-type impurities are implanted using the gate electrodes 18, 18 as a mask at a dose of $3.5\times10^{13}$ cm$^{-2}$ during the present process.

Subsequently, another implantation with boron ions is performed into the region for forming a protective transistor at a dose of about $1\times10^{13}$ cm$^{-2}$ using the LOCOS oxide films 20c and 20d, as a mask.

Thereafter, by subjecting the structure to thermal diffusion process: at about 1100° C. for about 120 minutes, the N-channel diffusion layer 34 is formed in N-well region 4, and the P-type low concentration diffusion layer 24 is formed on the periphery of the N-well region 4 where a protective diode is to be formed.

Figure 9D:
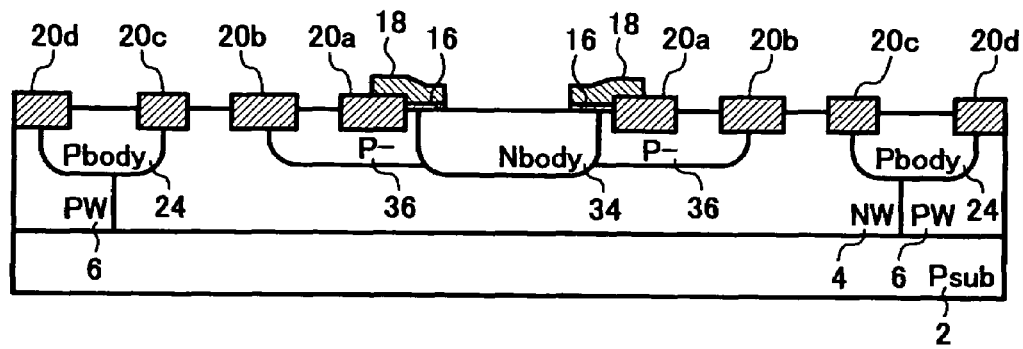
Figure 9E:
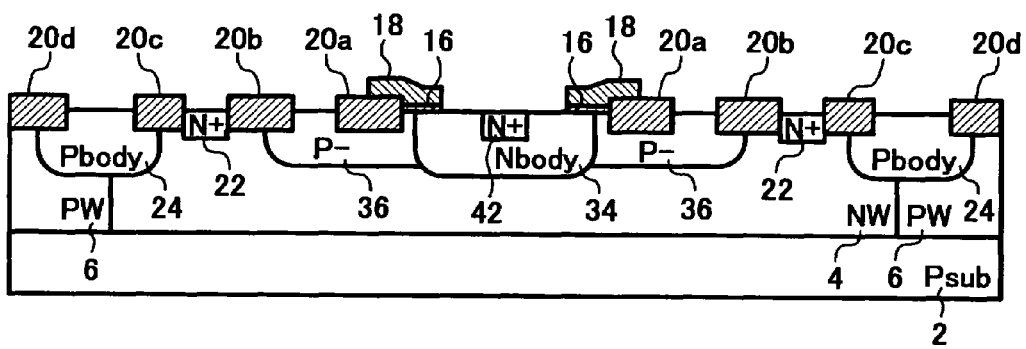

The amount of implantation, and thermal diffusion of the ions are optimized according to withstand, and threshold voltages of the LDMOS transistor to be formed. (FIG. 9D)

(5) The P-type low concentration diffusion layer 24 and N-type guard ring region 22 are formed simultaneously with forming sources and drains of CMOS transistors included in peripheral circuits. This is carried out by implanting arsenic ions as N-type impurities to a high concentration using a resist layer and LOCOS oxide films 20b, and 20c, as masks; and subjecting the structure to heat treatment at about 950° C.

The N-type guard ring region 22 is formed using LOCOS oxide layers 20b and 20c, as a mask. (FIG. 9E)

(6) Subsequently formed are P-sources 40 in N-channel diffusion layer 34 in the self-aligned manner with respect to the gate electrode 18, and the P-type high concentration diffusion layer 26 in P-type low concentration diffusion layer 24 using the LOCOS oxide films 20c and 20d, as a mask, by implanting $BF_2$ for creating P-type impurities in a relatively high concentration using a resist layer and LOCOS oxide films 20a, 20b, 20c and 20d, as masks, and subjecting the structure to heat treatment at about 900° C. (FIG. 8)

The above noted heat treatments may be performed in combination with a reflow process of BPSG film, which is to be carried out afterward for forming interlayer insulators.

Conventional CMOS process steps (not shown) will follow for completing the device fabrication such as forming the interlayer insulators of BPSG film, contact holes for electrical connection and wiring, and passivating films, among others.

The semiconductor device according to the sixth modification (FIG. 8) to the first embodiment of the disclosure can offer the advantages similar to those by the first embodiment device (FIG. 1A) excepting the formation of the P-type low concentration diffusion layer 24 in simultaneous with the transistor forming region. In addition, by forming the P-type low concentration diffusion layer 24 in simultaneous with P-type drain 36, the former layer 24 can be formed without supplementing further process steps.

Figure 10:
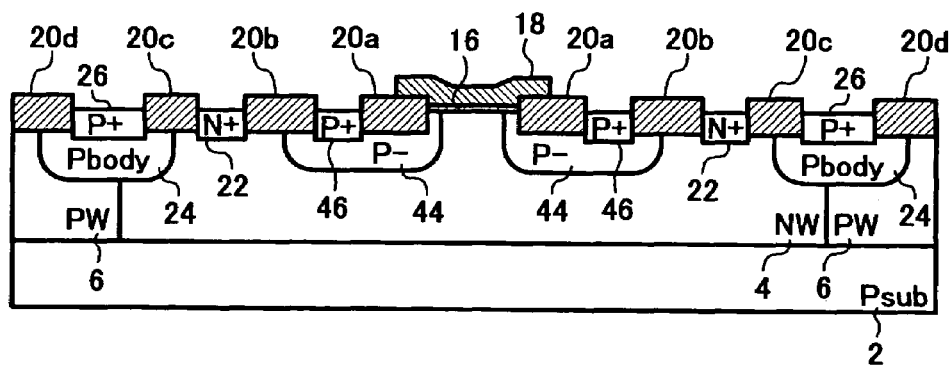
FIG. 10 is a cross-sectional view illustrating a seventh modification to the first embodiment shown in FIGS. 1A and 1B.

FIG. 10 is a cross-sectional view illustrating a semiconductor device according to a seventh modification to the first embodiment of the disclosure.

Although only the regions for forming a P-channel type LOCOS offset transistor and protective diodes are shown in FIG. 10, it may be noted that other device components including N-channel type LOCOS offset transistors and other elements are also included in the device.

The components in the semiconductor device of FIG. 10 that are similar to those of the device described earlier in reference to FIG. 1A are shown with identical numerical representations.

Referring to FIG. 10, an N-type well region (NW) 4 and a P-type well region (PW) 6 are formed on a P-type semiconductor substrate (Psub) 2.

Two P-type low concentration diffusion layers (P−) 44, 44 are formed spatially separated with each other in the N-well region 4.

A P-type high concentration diffusion layer 46 is formed in each of the diffusion layers 44. The P-type low concentration diffusion layers 44 and P-type high concentration diffusion layer 46 constitute a source or a drain.

A LOCOS oxide layer 20a is formed on the surface of P-type low concentration diffusion layers 44 between the P-type high concentration diffusion layers 46, 46.

A gate electrode 18 is formed between the P-type high concentration diffusion layers 46, 46 on the surface of P-type low concentration diffusion layers 44 and N-type well region 4 with an underlying gate oxide layer 16.

This gate electrode 18 is formed so as to overlie the gate oxide layer 16 and to extend covering the portion of LOCOS oxide layers 20a, 20a. Each of the sides of the gate electrode 18 is provided spatially separated from P-type high concentration diffusion layer 46 by the interposing portion of the LOCOS oxide layer 20a.

Surrounding LOCOS offset transistor forming region, an N-type guard ring region 22 is formed in the shape of a frame inside the periphery of, and spatially separated from a boundary of, the N-well region 4.

Another LOCOS oxide layer 20b is formed on the surface of the N-well region 4 between N-type guard ring region 22 and P-type drain 46.

Surrounding the N-type guard ring region 22, a P-type low concentration diffusion layer (Pbody) 24 is formed in the shape of a frame on the periphery of the N-well region 4 in contact with both N-well region 4 and P-well region 6.

In addition, a P-type high concentration diffusion layer (P+) 26 is formed frame-shaped in the P-type low concentration diffusion layer 24.

LOCOS oxide layer 20c is formed between N-type guard ring region 22 and P-type high concentration diffusion layer 26 on the surface region of N-well region 4 and P-type low concentration diffusion layer 24.

A LOCOS oxide layer 20d is formed on the surface region of P-well region 6 and P-type low concentration diffusion layer 24 opposite to N-type guard ring region 22 with respect to P-type high concentration diffusion layer 26.

Surrounding the P-channel LDMOS forming region, a protective diode is formed of N-type guard ring region 22, N-well region 4, P-type low concentration diffusion layer 24, and P-type high concentration diffusion layer 26.

FIGS. 11A through 11E are cross-sectional views illustrating the semiconductor device during various stages in the fabrication process according to the seventh modification to the first embodiment of the disclosure. This fabrication process relates primarily to the formation of a 35V protective diode in combination with a P-channel LOCOS offset transistor rated at 30V.

Although N-channel LOCOS offset transistors are also formed during the process in addition to the P-channel LOCOS offset transistor, the description on the former is herein abbreviated for purposes of clarity.

Figure 11A:
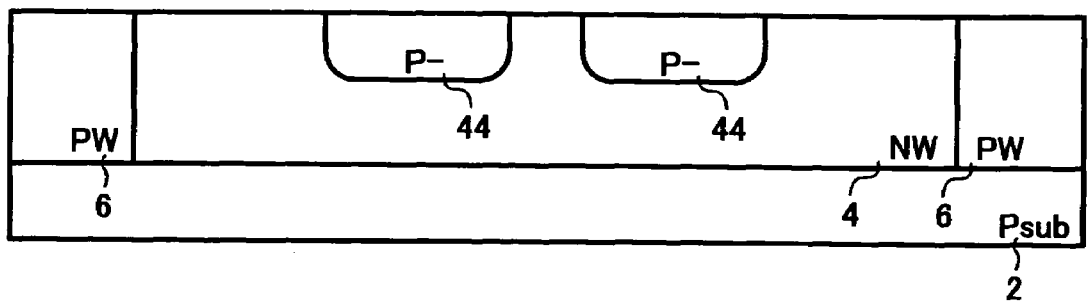
FIGS. 11A through 11E are cross-sectional views illustrating the semiconductor device during various stages in the fabrication process according to the seventh modification shown in FIG. 10.
Figure 11B:
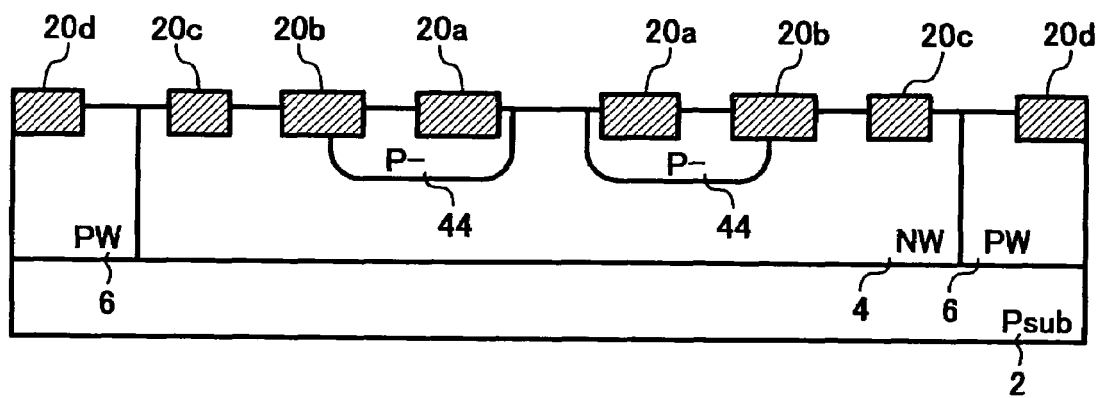
Figure 11C:
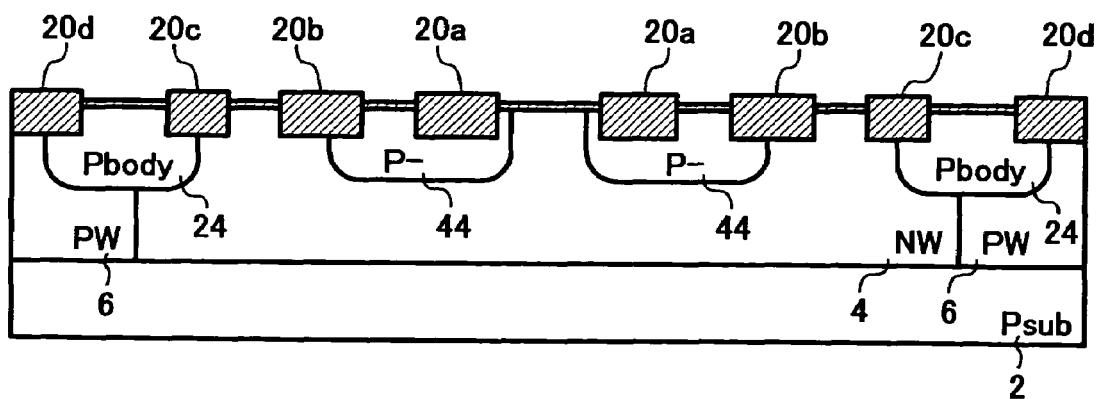

The fabrication process will be described herein below in reference to FIGS. 10 through 11E.

(1) A silicon oxide film is formed by thermal oxidation on the surface of a P-type semiconductor substrate 2 having a thickness of about 25 mn.

A first resist film is then formed by the photolithography method to expose the region where an N-well is to be formed. With the use of thus prepared first resist film as a mask, phosphorus ions as N-type impurities are implanted under the conditions of an acceleration voltage of about 150 keV and a dose of $(5.0~8.0) \times 10^{12}$ cm$^{-2}$.

Subsequent to the removal of the first resist film, a second resist film is formed to mask the N-well forming region. Using the second resist film as a mask, boron ions as P-type impurities are implanted under the conditions of an acceleration voltage of about 30 keV and a dose of about $(2.0~5.0) \times 10^{13}$ cm$^{-2}$.

After removing the second resist film, the structure is subjected to heat treatment at about 1150° C. to form N-well region 4 having a surface impurity concentration of $(5.0~10.0) \times 10^{15}$ phosphorus ions/cm$^{-3}$ and a depth of (6~8) μm, and P-well region 6.

The surface impurity concentration, and the diffusion depth of N-well region 4 are suitably optimized according to a withstand voltage of the LOCOS offset transistor to be formed. In addition, the surface impurity concentration of the P-well region 6, as the portion other than the N-well region 4, is optimized according to the characteristics of peripheral Nch transistors to be loaded in combination.

Subsequent to the removal of the silicon oxide film from the surface of the semiconductor substrate 2, another silicon oxide film is formed by thermal oxidation having a thickness of about 25 mn.

Another ion implantation is performed into the regions for forming a source and a drain of LOCOS offset transistor with boron ions under the conditions of an acceleration voltage of about 30 keV and a dose of $(1.0~3.0) \times 10^{13}$ cm$^{-2}$, which is followed by heat treatment at about 1100° C. to form P-type low concentration layers 44, 44. (FIG. 11A)

(2) A silicon nitride film is disposed by LP-CVD method and subjected to a patterning process with photolithography and etching techniques such that only the portions of the silicon nitride film overlying active regions are left un-removed.

After performing another implantation for preventing the parasitic MOS channel conduction, a relatively thick oxide film is grown at about 1000° C. to a thickness ranging from 600 to 800 nm, whereby LOCOS oxide films 20a, 20b, 20c, and 20d are formed.

Thereafter, both the silicon nitride film and the underlying silicon oxide film are removed. (FIG. 11B)

(3) Both the silicon nitride film and the underlying silicon oxide film, which were used for forming the LOCOS oxide films, are removed, and a gate oxide layer 16 is formed by thermal oxidation to a thickness of about 80 nm.

Subsequently, an implantation process with boron ions is performed into the region for forming a protective transistor at a dose of about $1 \times 10^3$ cm$^{-2}$ using the LOCOS oxide films 20c and 20d, as a mask.

Thereafter, by subjecting the structure to thermal diffusion process at about 1100° C., the N-channel diffusion layer 34 is formed in N-well region 4, and the P-type low concentration diffusion layer 24 is formed on the periphery of the N-well region 4 where a protective diode is to be formed. (FIG. 11C)

Figure 11D:
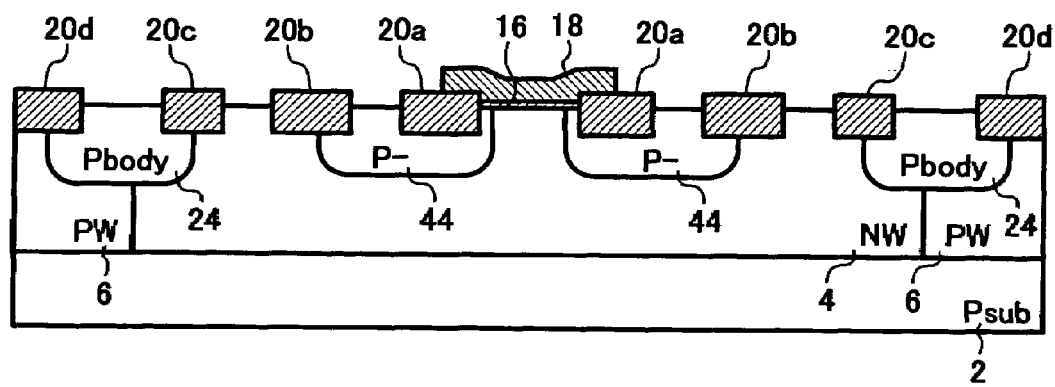
Figure 11E:
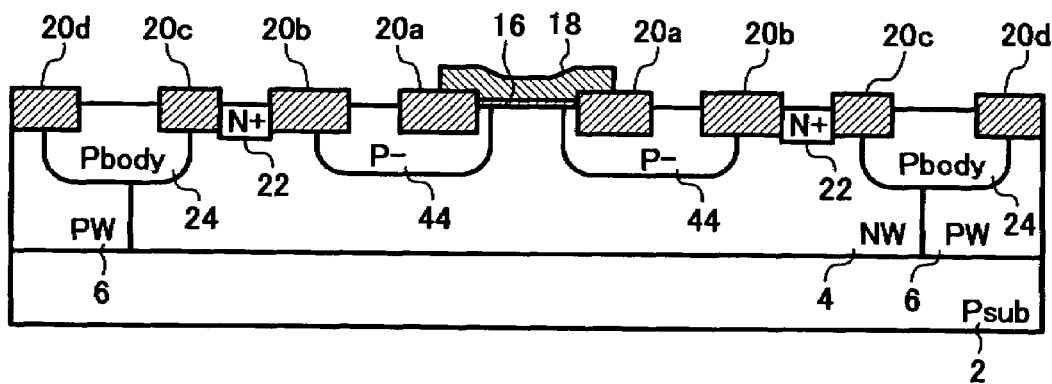

A polysilicon film for forming gate electrodes is formed by CVD method and subjected to a patterning process to form a predetermined shape with photolithography and etching techniques, whereby gate electrodes 18, 18 are formed (FIG. 11D).

The N-type guard ring region 22 is formed by implanting arsenic ions as N-type impurities to a high concentration using a resist layer and LOCOS oxide films 20b, and 20c, as a mask, and performing a heat treatment at about 950° C. (FIG. 11E).

(6) The P-type high concentration diffusion layer 46 is formed in P-type low concentration diffusion layers 44 by implanting BF$_2$ for creating P-type impurities to a relatively high concentration using a resist layer and LOCOS oxide films 20a, 20b, 20c and 20d, as masks, and performing heat treatment at about 900° C., and the P-type high concentration diffusion layer 26 is formed in P-type low concentration diffusion layer 24 using LOCOS oxide films 20c and 20d, as a mask (FIG. 10).

The above noted heat treatments may be performed in combination with a reflow process of BPSG film, which is to be carried out afterward for forming interlayer insulators.

Conventional CMOS process steps (not shown) will follow for completing the device fabrication such as forming the interlayer insulators of BPSG film, contact holes for electrical connection and wiring, and passivating films, among others.

The semiconductor device according to the seventh modification (FIG. 10) to the first embodiment of the disclosure can offer the advantages similar to those by the first embodiment device (FIG. 1A) excepting the formation of the P-type low concentration diffusion layer 24 in simultaneous with the transistor forming region.

Although the transistors have been illustrated in the above embodiment and modifications such as N-channel type LDMOS transistor (FIG. 1A), P-channel type LDMOS transistor (FIG. 8), and P-channel type LOCOS offset transistor (FIG. 10), the disclosure is not intended to be limited to the transistors.

Figure 12A:
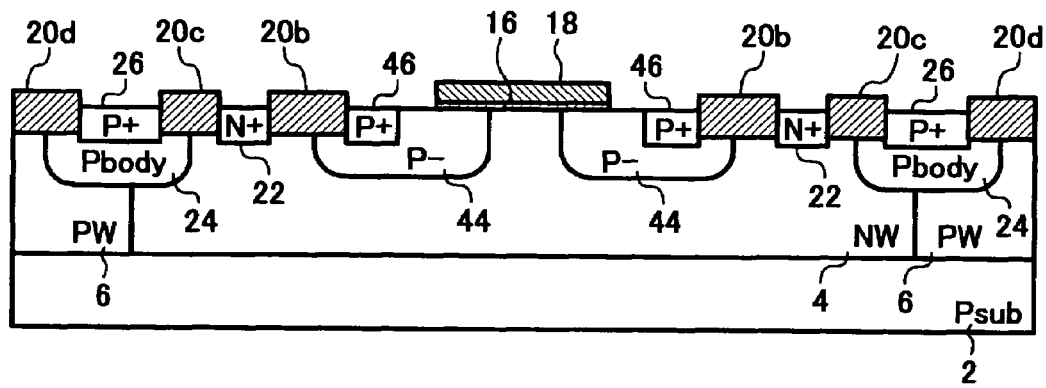
FIG. 12A is a cross-sectional view illustrating a semiconductor device, in which a mask LDD structure is incorporated into the transistor of FIG. 8.
Figure 12B:
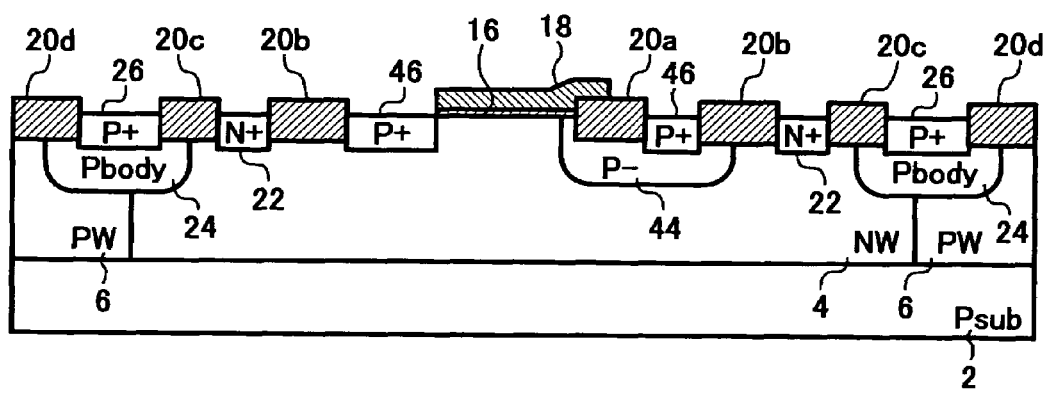
FIG. 12B is a cross-sectional view illustrating another semiconductor device, in which a one-side LOCOS offset type structure is incorporated into the transistor of FIG. 8.
Figure 12C:
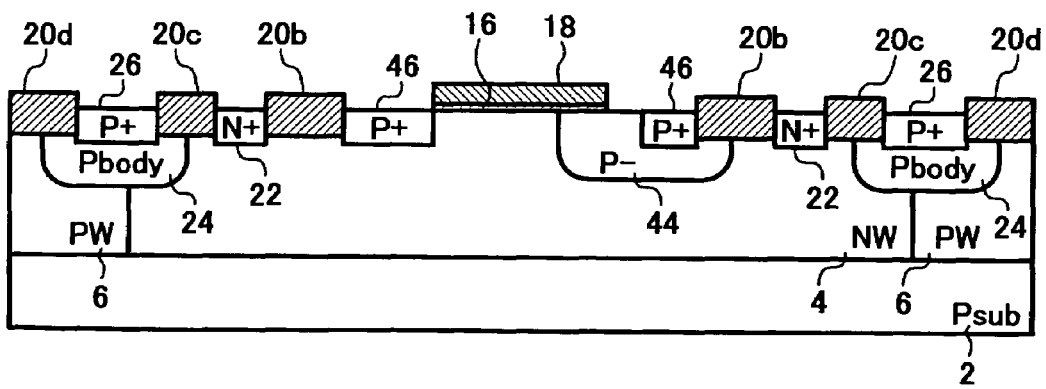
FIG. 12C is a cross-sectional view illustrating still another semiconductor device, in which a one-side mask LDD structure is incorporated into the transistor of FIG. 8.

For example, several similar transistors may alternatively be utilized such as one with the mask LDD (lightly doped drain) structure illustrated in FIG. 12A, the one-side LOCOS offset type of FIG. 12B, or the one-side mask LDD structure of FIG. 12C.

Alternatively, a plurality of transistors may be loaded in combination on a single semiconductor substrate each having a different type or structure.

Moreover, the structure of the guard ring region may alternatively be formed of a double-diffusion layer, which is disposed in the self-aligned manner using a thick oxide layer as a mask, including a low concentration diffusion layer having a second conductivity-type impurity concentration higher than a first conductively-type well region, and a high concentration diffusion layer having the second conductivity-type impurity concentration higher than the low concentration diffusion layer.

Figure 13:
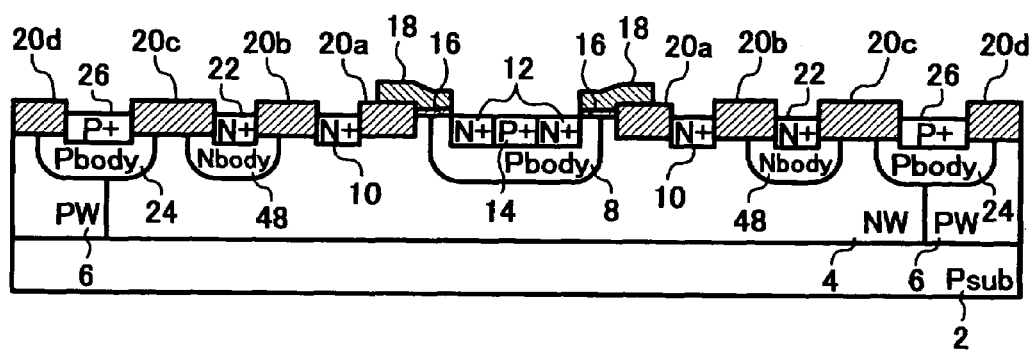
FIG. 13 is a cross-sectional view illustrating an eighth modification to the first embodiment shown in FIGS. 1A and 1B.

FIG. 13 is a cross-sectional view illustrating a semiconductor device according to an eighth modification to the first embodiment of the disclosure.

Although only the regions for forming an N-channel type LDMOS transistor and protective diodes are shown in FIG. 13, it may be noted that other device components including CMOS transistors and other elements are also included in the device.

The components in the semiconductor device of FIG. 13 that are similar to those of the device described earlier in reference to FIG. 1A are shown with identical numerical representations, and detailed description thereof is herein abbreviated.

The semiconductor device according to the eighth modification to the first embodiment has a construction similar to the first embodiment of FIG. 1A, with the exception that a guard ring region consists of an N-type guard ring region 22 and an N-type low concentration diffusion layer (Nbody) 48 formed covering the N-type guard ring region 22.

This N-type low concentration diffusion layer 48 is formed in the self-aligned manner with respect to the LOCOS oxide layers 20b and 20c.

The N-type low concentration diffusion layer 48 has an N-type impurity concentration higher than the N-well region 4 and lower than the N-type guard ring region 22.

Figure 14:
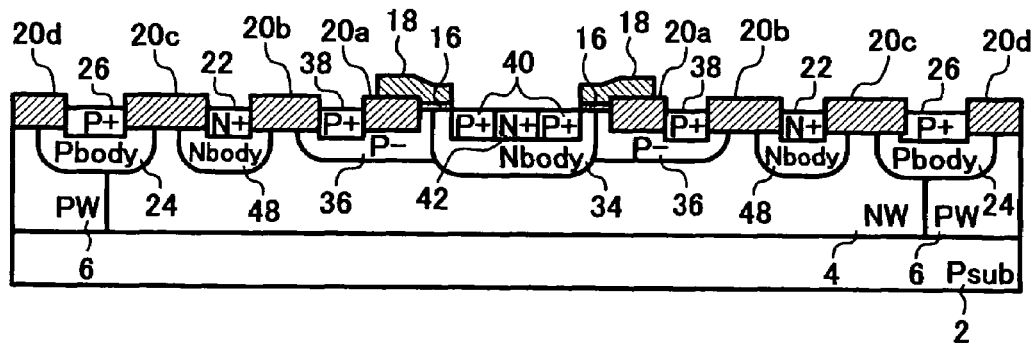
FIG. 14 is a cross-sectional view illustrating a ninth modification to the first embodiment shown in FIGS. 1A and 1B.

FIG. 14 is a cross-sectional view illustrating a semiconductor device according to a ninth modification to the first embodiment of the disclosure.

Although only the regions for forming a P-channel type LDMOS transistor and protective diodes are shown in FIG. 14, it may be noted that other device components including CMOS transistors and other elements are also included in the device.

The components in the semiconductor device of FIG. 14 that are similar to those of the device described earlier in reference to FIGS. 1A and 8 are shown with identical numerical representations, and detailed description thereof is herein abbreviated.

The semiconductor device according to the ninth modification has a construction similar to the aforementioned sixth modification of FIG. 8, with the exception that a guard ring region consists of an N-type guard ring region 22 and an N-type low concentration diffusion layer (Nbody) 48 formed so as to cover the N-type guard ring region 22.

This N-type low concentration diffusion layer 48 is formed in the self-aligned manner with respect to LOCOS oxide layers 20b and 20c, in simultaneously with N-type channel diffusion layer 34.

The N-type low concentration diffusion layer 48 has an N-type impurity concentration higher than the N-well region 4 and lower than the N-type guard ring region 22.

In addition, by forming the N-type low concentration diffusion layer 48 in simultaneous with N-type channel diffusion layer 34, the former layer 48 can be formed without supplementing further process steps.

Incidentally, it may be added that the N-type low concentration diffusion layer 48 may not be formed always in simultaneous with N-type channel diffusion layer 34.

In the both the eighth and ninth modifications respectively shown in FIGS. 13 and 14, the value of threshold voltage of the protective transistor can suitably be adjusted by changing the distance between the substitute pickup region including P-type low concentration diffusion layer 24 and P-type high concentration diffusion layer 26, and the guard ring region including N-type guard ring region 22 and N-type low concentration diffusion layer 48.

In addition, since the N-type guard ring region 22, N-type low concentration diffusion layer 48, P-type low concentration diffusion layer 24, and P-type high concentration diffusion layer 26 are all formed using the LOCOS oxide layer 20c as a mask, the distance between either P-type low concentration diffusion layer 24 or P-type high concentration diffusion layer 26 and either N-type guard ring region 22 and N-type low concentration diffusion layer 48 can be formed as predetermined without being much affected by the deviation in the location resulted from mask positioning, whereby the protective resistor can be formed having a stable or reproducible value of the withstand voltage.

It is needless to add that the abovementioned structure of the guard ring region, which consists of N-type guard ring region 22 and N-type low concentration diffusion layer formed so as to cover the N-type guard ring region 22, may also be adapted to the semiconductor devices illustrated in reference to FIGS. 4A through 8, 10, 12A, 12B, and 12C.

As described herein above, the semiconductor devices according to the first embodiment and its modifications are each provided with the substrate pickup region formed of a double-diffusion layer including P-type low concentration diffusion layer 24 and P-type high concentration diffusion layer 26. The structure of the device, however, is not limited to the double layer structure, but the substrate pickup region may be formed of a single diffusion layer.

Figure 15A:
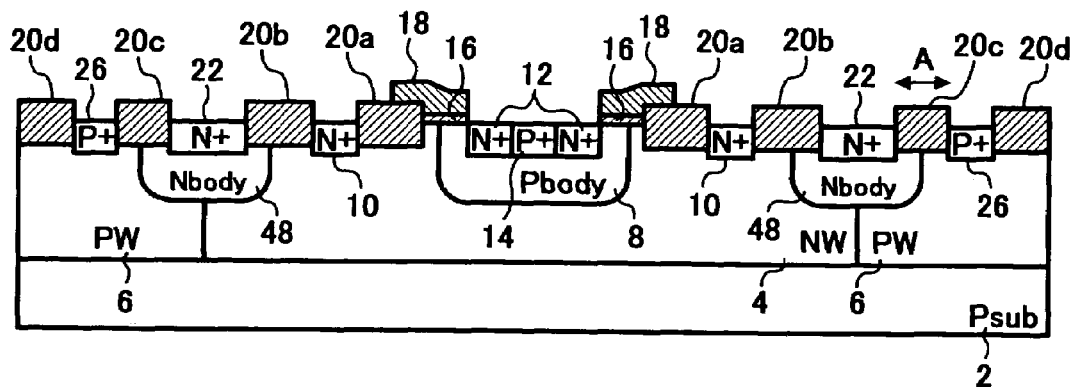
Figure 15B:
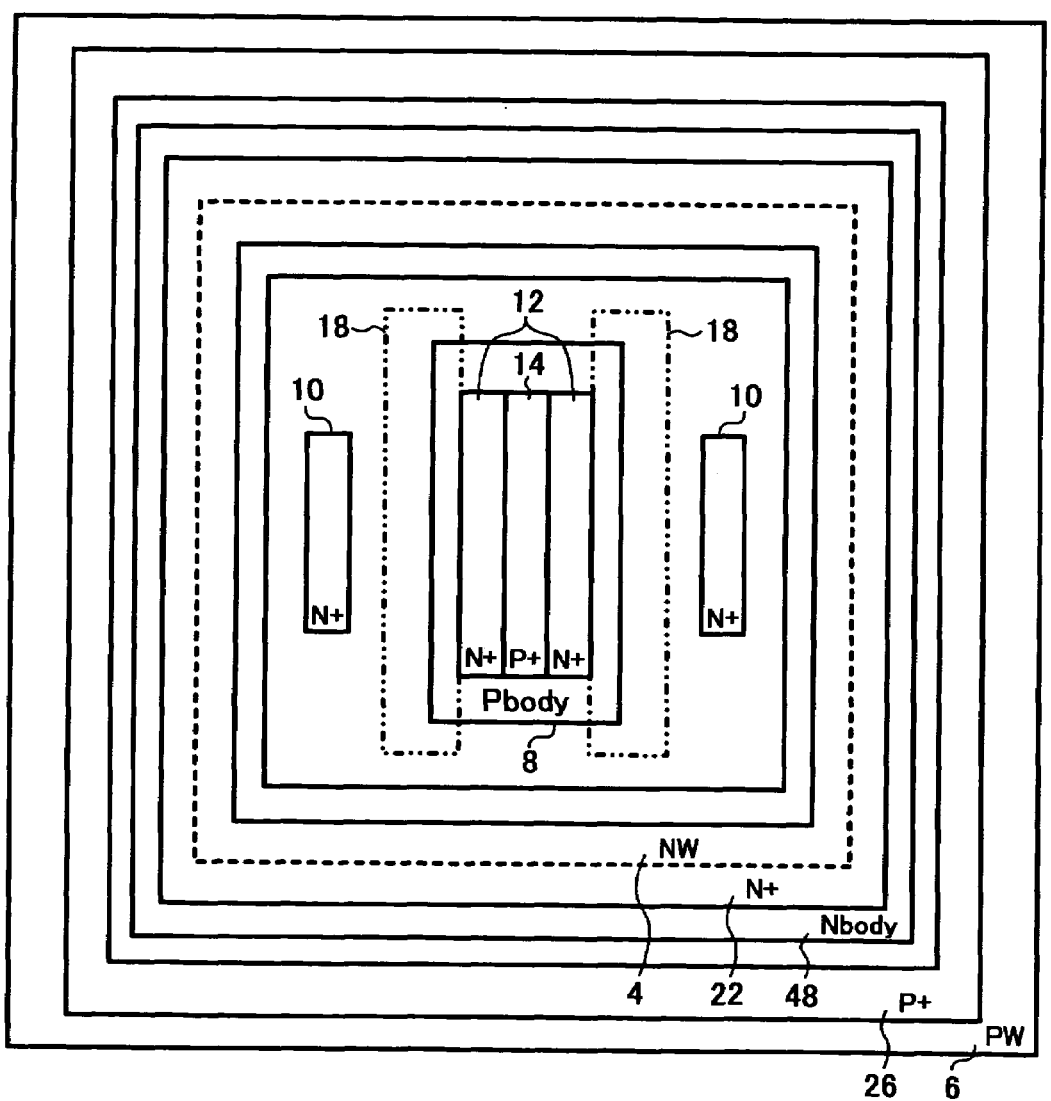

FIGS. 15A and 15B illustrate a semiconductor device according to a second embodiment of the disclosure, in which FIG. 15A is a cross-sectional view, and FIG. 15B is a top view of the semiconductor device.

Although only the regions for forming an N-channel type LDMOS transistor and protective diodes are shown in FIGS. 15A and 15B, it may be noted that other device components including CMOS transistors and other elements are also included in the device.

The components in the semiconductor device of FIGS. 15A and 15B that are similar to those of the device described earlier in reference to FIG. 1A are shown with identical numerical representations, and detailed description thereof is herein abbreviated.

Referring to FIGS. 15A and 15B, an N-type well region (NW) 4 and a P-type well region (PW) 6 are formed on a P-type semiconductor substrate (Psub) 2.

A P-type channel diffusion layer (Pbody) 8 and an N-type drain (N+) 10 are formed spatially separated with each other in the N-well region 4.

In addition, an N-type source (N+) 12 and a P-type channel diffusion pickup region (P+) 14 are formed in the P-channel diffusion layer 8.

A gate electrode 18 is formed between N-source 12 and N-drain 10 on the semiconductor substrate 2 with an underlying gate oxide layer 16.

This gate electrode 18 is formed so as to overlie the gate oxide layer 16 and to extend covering a portion of LOCOS oxide layer 20a.

Surrounding LDMOS transistor forming region, an N-type low concentration diffusion layer (Nbody) 48 is formed in contact with both N-well region 4 and P-well region 6 on the periphery of the N-well region 4.

The N-type low concentration diffusion layer 48 has an N-type impurity concentration higher than the N-well region 4.

In addition, an N-type guard ring region (high concentration diffusion layer N+) 22 is formed frame-shaped in the N-type low concentration diffusion layer 48.

The N-type low concentration diffusion layer 48 and N-type guard ring region 22 constitute a guard ring region in the semiconductor device of the second embodiment.

A LOCOS oxide layer 20b is formed between N-type guard ring region 22 and N-type drain 10 on the surface of N-well region 4.

The N-type low concentration diffusion layer 48 and N-type guard ring region 22 are formed using LOCOS oxide layers 20b and 20c, as a mask.

Surrounding the region of N-type low concentration diffusion layer 48, a P-type high concentration diffusion layer (P+) 26 for constituting a substrate pickup region is formed in the shape of a frame outside the periphery of, and spatially separated from the N-well region 4.

The P-type high concentration diffusion layer 26 has a P-type impurity concentration higher than P-well region 6.

A LOCOS oxide layer 20c is formed between N-type guard ring region 22 and P-type high concentration diffusion layer 26 on the surface of N-type low concentration diffusion layer 48 and P-well region 6, and a LOCOS oxide layer 20d is formed on the surface of P-well region 6.

The P-type high concentration diffusion layer 26 is formed using LOCOS oxide layers 20c and 20d, as a mask.

Surrounding the P-channel LDMOS forming region, a protective diode is formed of N-type guard ring region 22, N-type low concentration diffusion layer 48, P-well region 6, and P-type high concentration diffusion layer 26.

The semiconductor device according to the second embodiment of the disclosure is formed by the process steps similar to those described earlier in reference to FIGS. 2A through 2E, with the exception that a change is made in the region for forming the N-well region 4 and the step for forming N-type low concentration diffusion layer 48 is supplemented.

In the semiconductor device of the present embodiment, the junction between the N-well region 4 and P-well region 6 is situated under the N-type low concentration diffusion layer 48 (guard ring region).

As a result, the dispersion can be decreased in the threshold voltage of protective diodes caused by the deviation in the location resulted from mask positioning, and the value of threshold voltage can suitably be adjusted by changing the distance between the guard ring region including N-type guard ring region 22 and the substrate pickup region consisting of P-type high concentration diffusion layer 26.

In addition, since the N-type guard ring region 22, N-type low concentration diffusion layer 48, and P-type high concentration diffusion layer 26 are all formed using the LOCOS oxide layer 20c (with its size "A") as a mask, the distance between the P-type high concentration diffusion layer 26, and the N-type guard ring region 22 or N-type low concentration diffusion layer 48, can be formed as predetermined without being much affected by the deviation in the location resulted from mask positioning, whereby the protective resistor can be formed having a stable or reproducible withstand voltage.

Figure 16:
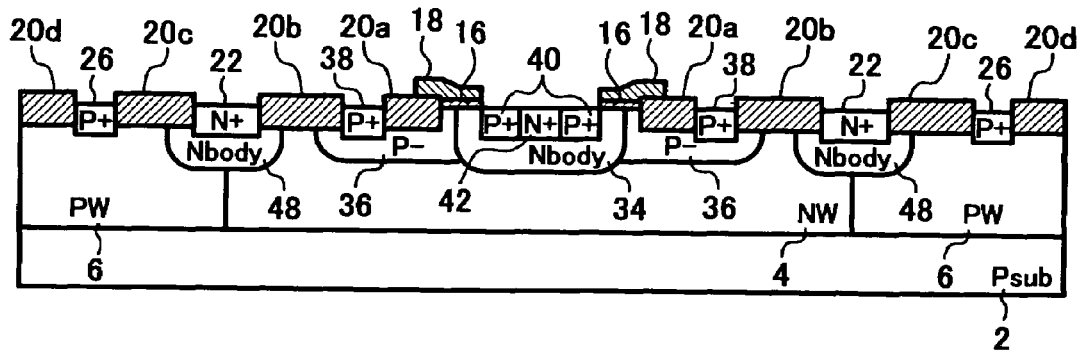
FIG. 16 is a cross-sectional view illustrating a first modification to the second embodiment shown in FIGS. 15A and 15B.

FIG. 16 is a cross-sectional view illustrating a semiconductor device according to a first modification to the second embodiment of the disclosure.

Although only the regions for forming a P-channel type LDMOS transistor and protective diodes are shown in FIG. 16, it may be noted that other device components including CMOS transistors and other elements are also included in the device.

The components in the semiconductor device of FIG. 16 that are similar to those of the devices described earlier in reference to FIGS. 1A, 15A and 15B are shown with identical numerical representations.

Referring to FIG. 16, an N-type well region (NW) 4 and a P-type well region (PW) 6 are formed on a P-type semiconductor substrate (Psub) 2.

An N-type channel diffusion layer (Nbody) 34 and a P-type low concentration drain (P−) 36 are formed adjacent to each other in the N-well region 4.

A P-type drain (P+) 38 is formed in the P-type low concentration drain (P−) 36.

In addition, a P-type source (P+) 40 and an N-type channel diffusion pickup region (N+) 42 in the N-type channel diffusion layer 34.

A gate electrode 18 is formed between P-source 40 and P-drain 38 on the semiconductor substrate 2 with an underlying gate oxide layer 16. This, gate electrode 18 is formed so as to extend covering the portion of LOCOS oxide layer 20a.

Surrounding LDMOS transistor forming region, an N-type low concentration diffusion layer (Nbody) 48 is formed in contact with both N-well region 4 and P-well region 6 on the periphery of the N-well region 4.

In addition, an N-type guard ring region (N+) 22 is formed frame-shaped in the N-type low concentration diffusion layer 48. The N-type low concentration diffusion layer 48 is formed in simultaneously with the N-type channel diffusion layer 34.

A LOCOS oxide layer 20b is formed between N-type guard ring region 22 and N-type drain 10 on the surface of N-well region 4.

Surrounding the region of N-type low concentration diffusion layer 48, a P-type high concentration diffusion layer (P+) 26 for constituting a substrate pickup region is formed in the shape of a frame outside the periphery of, and spatially separated from the N-well region 4.

A LOCOS oxide layer 20c is formed between N-type guard ring region 22 and P-type high concentration diffusion layer 26 on the surface of N-type low concentration diffusion layer 48 and P-well region 6, and a LOCOS oxide layer 20d is formed on the surface of P-well region 6.

Surrounding the P-channel LDMOS forming region, a protective diode is formed of N-type guard ring region 22, N-type low concentration diffusion layer 48, P-well region 6, and P-type high concentration diffusion layer 26.

The semiconductor device according to the first modification to the second embodiment is formed by the process steps similar to those described earlier in reference to FIGS. 9A through 9E, with the exception that a change is made in the region for forming the N-well region 4 and the N-type low concentration diffusion layer 48 is formed in simultaneously with the N-type channel diffusion layer 34.

The semiconductor device according to the first modification (FIG. 16) to the second embodiment can offer the advantages similar to those by the second embodiment device (FIGS. 15A and 15B).

In addition, since the N-type low concentration diffusion layer 48 is formed simultaneously with the N-type channel diffusion layer 34, the former layer can be formed without increasing the number of process steps.

Incidentally, it may be added that the N-type low concentration diffusion layer 48 may not be formed always in simultaneous with N-type channel diffusion layer 34.

Moreover, the structure of the guard ring region may alternatively be formed of a double-diffusion layer, which is disposed in the self-aligned manner using a thick oxide layer as a mask, including a low concentration diffusion layer having a second conductivity-type impurity concentration higher than a first conductively-type well region, and a high concentration diffusion layer having the second conductivity-type impurity concentration higher than the low concentration diffusion layer.

Figure 17:
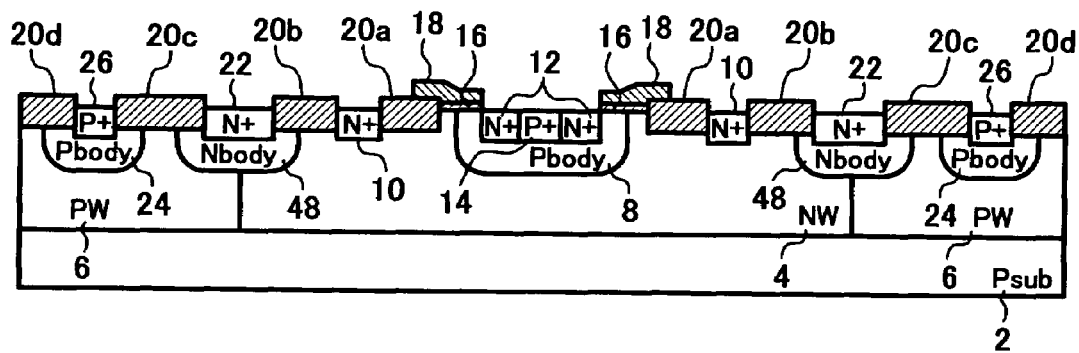
FIG. 17 is a cross-sectional view illustrating a second modification to the second embodiment shown in FIGS. 15A and 15B.

FIG. 17 is a cross-sectional view illustrating a semiconductor device according to a second modification to the second embodiment of the disclosure.

Although only the regions for forming an N-channel type LDMOS transistor and protective diodes are shown in FIG. 17, it may be noted that other device components including CMOS transistors and other elements are also included in the device.

The components in the semiconductor device of FIG. 17 that are similar to those of the devices described earlier in reference to FIGS. 1A, 15A and 15B are shown with identical numerical representations, and detailed description thereof is herein abbreviated.

The semiconductor device according to the second modification to the second embodiment has a construction similar to the aforementioned second embodiment of FIGS. 15A and 15B, with the exception that a substrate pickup region is formed of a double-diffusion layer including P-type high concentration diffusion layer 26 and the P-type low concentration diffusion layer (Pbody) 24 formed so as to cover the P-type high concentration diffusion layer 26.

This P-type low concentration diffusion layer 24 is formed in the self-aligned manner with respect to LOCOS oxide layers 20c and 20d.

The P-type low concentration diffusion layer 24 has a P-type impurity concentration higher than P-well region 6 and lower than P-type high concentration diffusion layer 26.

In addition, by forming the P-type low concentration diffusion layer 24 in simultaneous with P-channel diffusion layer 8, the former layer 24 can be formed without supplementing further process steps.

Incidentally, it may be added that the P-type low concentration diffusion layer 24 may not be formed always in simultaneous with P-channel diffusion layer 8.

Figure 18:
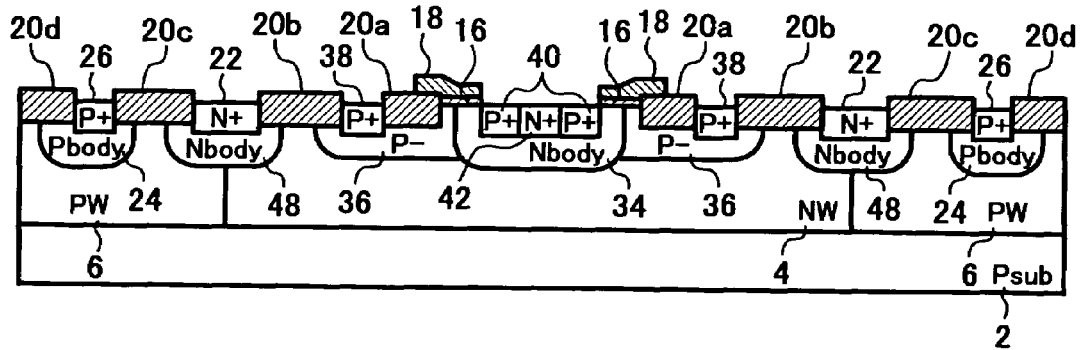
FIG. 18 is a cross-sectional view illustrating a third modification to the second embodiment shown in FIGS. 15A and 15B.

FIG. 18 is a cross-sectional view illustrating a semiconductor device according to a second modification to the second embodiment of the disclosure.

Although only the regions for forming a P-channel type LDMOS transistor and protective diodes are shown in FIG. 18, it may be noted that other device components including CMOS transistors and other elements are also included in the device.

The components in the semiconductor device of FIG. 18 that are similar to those of the devices described earlier in reference to FIGS. 1A, 8 and 16 are shown with identical numerical representations, and detailed description thereof is herein abbreviated.

The semiconductor device according to the second modification to the second embodiment has a construction similar to the abovementioned first modification to the second embodiment (FIG. 16), with the exception that a substrate pickup region is formed of a double-diffusion layer including P-type high concentration diffusion layer 26 and the P-type low concentration diffusion layer (Pbody) 24 formed so as to cover the P-type high concentration diffusion layer 26.

This P-type low concentration diffusion layer 24 is formed in the self-aligned manner with respect to LOCOS oxide layers 20c and 20d.

The P-type low concentration diffusion layer 24 has a P-type impurity concentration higher than P-well region 6 and lower than P-type high concentration diffusion layer 26.

In the both the second and third modifications to the second embodiment respectively shown in FIGS. 17 and 18, the value of threshold voltage of the protective transistor can suitably be adjusted by changing the distance between the substitute pickup region including P-type low concentration diffusion layer 24 and P-type high concentration diffusion layer 26, and the guard ring region consisting of N-type guard ring region 22 and N-type low concentration diffusion layer 48.

In addition, since the N-type guard ring region 22, N-type low concentration diffusion layer 48, P-type low concentration diffusion layer 24, and P-type high concentration diffusion layer 26 are all formed using the LOCOS oxide layer 20c as a mask, the distance between either P-type low concentration diffusion layer 24 or P-type high concentration diffusion layer 26 and either N-type guard ring region 22 and N-type low concentration diffusion layer 48 can be formed as predetermined without being influenced by the deviation in the location resulted from mask positioning, whereby the protective resistor can be formed having a stable or reproducible value of the withstand voltage.

It is needless to add that the abovementioned structure of the guard ring region, which consists of N-type guard ring region 22 and N-type low concentration diffusion layer formed so as to cover the N-type guard ring region 22, may also be adapted to the semiconductor devices illustrated in reference to FIGS. 4A through 8, 10, 12A, 12B, and 12C.

As described herein above, the semiconductor devices according to the second embodiment and its modifications are each provided with the substrate pickup region formed of a double-diffusion layer including P-type low concentration diffusion layer 24 and P-type high concentration diffusion layer 26. The structure of the device is, however, not limited to the double layer structure, but the substrate pickup region may be formed of a single diffusion layer.

Moreover, in the second embodiment and the first through third modifications to the second embodiment respectively shown in FIGS. 15A through 18, since the protective diode is formed on the entire outer circumference of the LDMOS transistor forming region in the present embodiment, a particular region, which is otherwise required with relatively large area, is not necessary for forming the protective diode.

By contrast to the structure mentioned just above, the protective diode may not necessarily be formed on the entire outer circumference of the LDMOS transistor forming region, and may alternatively be formed as will be herein below.

For example, the protective diode may be formed such that the portions of the P-type low concentration diffusion layer 24 and P-type high concentration diffusion layer 26, as constituent layers of the substrate pickup region, be disposed corresponding to either the four sides or two opposing sides of the quadrilateral N-well region 4, as illustrated earlier in FIG. 4A or 4B, respectively, for the first modification to the first embodiment.

Still in addition, the protective diode may alternatively be formed such that one portion of the P-type low concentration diffusion layer 24 and P-type high concentration diffusion layer 26 is disposed corresponding to one side of the N-well region 4.

Thus, the location for providing the protective diode in the semiconductor device may be selected arbitrarily such as, for example, on the portion of the outer circumference of the LDMOS transistor forming region.

In addition, in the second embodiment and the second modification to the second embodiment shown in FIGS. 15A and 15B, and 17, respectively, the N-type drain 10 is formed in the abovementioned structures spatially separated from the N-type guard ring region 22.

Alternatively, as illustrated in FIGS. 5A and 5B, the protective diode may be formed such that the N-type drain 10 and the N-type guard ring region 22 are connected with each other.

By forming the LDMOS transistor with a connected N-type drain and N-type guard ring region, as mentioned above, the area taken by the LDMOS transistor and the protective transistor decreases, which in turn can reduce the chip area of the semiconductor device and its production costs.

Moreover, in the second embodiment and the first through third modifications to the second embodiment respectively shown in FIGS. 15A through 18, although the transistors have been illustrated in the above embodiment and modifications such as LDMOS transistors, the disclosure is not intended to be limited to the transistors.

For example, several transistors may alternatively be utilized such as ones other than the LDMOS transistor as illustrated earlier in FIGS. 10, and 12A through 12C.

In addition, in place of the LOCOS oxide films 20a, 20b, 20c, and 20d in the abovementioned structures, thick oxide films may alternatively be provided, each in the shape of a trapezoid without embedded into the semiconductor substrate 2, as illustrated in FIG. 7.

Still in addition, the semiconductor devices according to the second embodiment and its modifications are each provided with the guard ring region formed of a double-diffusion layer including N-type low concentration diffusion layer 48 and N-type guard ring region 22. However, the structure of the device is not limited to the double layer structure, but the guard ring region may be formed of a single diffusion layer.

Figure 19:
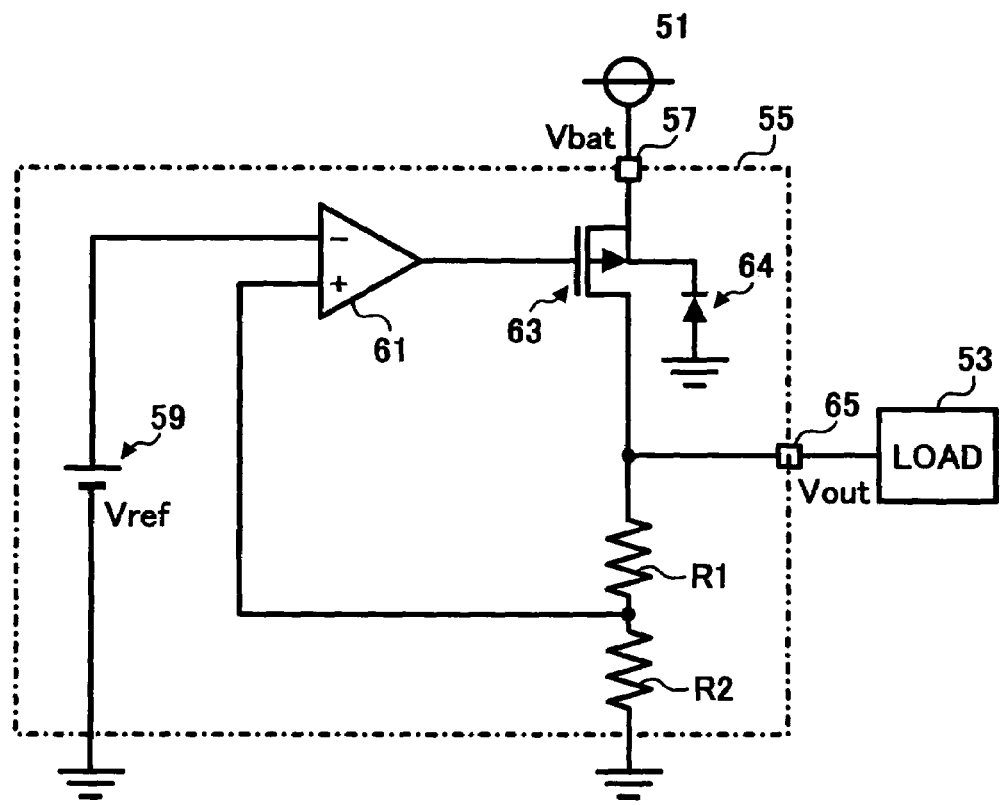
FIG. 19 is a diagrammatic circuit diagram illustrating a semiconductor apparatus employing a constant voltage generating circuit which incorporates the transistors and protective diodes of the present disclosure, in which the constant voltage generating circuit is configured to supply a stable power from a DC power source to a load.

FIG. 19 is a diagrammatic circuit diagram illustrating a semiconductor apparatus employing a constant voltage generating circuit which incorporates the transistors and protective diodes of the present disclosure.

Referring to FIG. 19, a constant voltage generating circuit 55 is configured to supply a stable power from a DC power source 51 to a load 53.

The constant voltage generating circuit 55 includes an input terminal (Vbat, source terminal) 57 to be connected to the DC power source 51, a reference voltage generator (Vref) 59, an operational amplifier 61, a P-channel MOS transistor 63 to serve as an output driver, a voltage divider including resistors R1 and R2, and an output terminal (Vout) 65.

A protective diode 64 is connected to the P-channel MOS transistor 63. The transistors and protective diodes of the disclosure described earlier according to embodiments and modifications thereof are each adapted to the P-channel MOS transistor 63 and protective diode 64, respectively.

The operational amplifier 61 is incorporated into the constant voltage generating circuit 55 such that its output terminal is connected to the gate of PMOS 63; the non-inverting terminal (+) is input with reference voltage, Vref, from the reference voltage generator 59; and the inverting terminal (−) is input with the output voltage (Vout) divided by the resistors R1 and R2.

The constant voltage generating circuit 55 is able to control the voltage divided by the resistors R1 and R2 to be equal to the reference voltage, Vref.

Therefore, the transistors and protective diodes of the present disclosure are suitably utilized in the constant voltage generating circuit which is capable of supplying power outputs with improved precision.

It is apparent from the above description including the examples disclosed that the semiconductor devices of the disclosure can offer several advantages over the previous devices, which follows.

With respect to the semiconductor device according to the first embodiment:

(1) The semiconductor device is formed so as to include the semiconductor substrate; the well region formed in the semiconductor substrate; the transistor formed in the well region; the guard ring region having an impurity concentration higher than the well region, formed on the surface of the semiconductor substrate inside the periphery of, and spatially separated from the boundary of, the well region; the substrate pickup region having an impurity concentration higher than the semiconductor substrate, formed on the periphery of the well region in contact with the well region and the semiconductor substrate; the thick oxide film formed on the surface of the semiconductor substrate between the guard ring region and the substrate pickup region; and the protective diode including the well region, the guard ring region, and the substrate pickup region. As a result, the junction between the substrate pickup region and semiconductor substrate is situated under the substrate pickup region; the dispersion in the threshold voltage of protective diodes, which is caused by the positional variation of well region through mask positioning, can be decreased; and the value of threshold voltage can suitably be adjusted by changing the distance between the guard ring region and the substrate pickup region, and the protective resistor having a stable withstand voltage can be provided.

(2) The substrate pickup region is formed with first double-diffusion layer including the low concentration diffusion layer formed in a self-aligned manner using the thick oxide film as a mask, and the high concentration diffusion layer having another impurity concentration higher than the low concentration diffusion layer; and the dispersion in the threshold voltage of protective diodes caused by the positional variation of well region through mask positioning can be decreased by forming the guard ring region, the low concentration diffusion layer, and the high concentration diffusion layer in self-aligned manner using the thick oxide layer as a mask. As a result, the junction breakdown during extracting the electric charges can be prevented, and the dispersion in the threshold voltage of protective diodes can be decreased.

(3) The low concentration diffusion layer is formed in the pickup region simultaneously with the channel region. As a result, the low concentration diffusion layer in the substrate pickup region in the LDMOS transistor can be formed without increasing either the number of process steps or production casts.

(4) The drain contact diffusion layer is formed in the well region contiguously to the guard ring region. As a result, the area taken by the LDMOS transistor and the protective transistor can be decreased, and in turn the chip area of the semiconductor device can also be decreased.

With respect to the semiconductor device according to the second embodiment:

(1) The semiconductor device is formed so as to include the semiconductor substrate; the well region formed in the semiconductor substrate; a transistor formed in the well region; a guard ring region having an impurity concentration higher than the well region, formed on a periphery of the well region in contact with the well region and the semiconductor substrate; a substrate pickup region having an impurity concentration higher than the semiconductor substrate, formed on a surface of the semiconductor substrate outside the periphery of, and spatially separated from the well region; a thick oxide film formed between the guard ring region and the substrate pickup region on the surface of the semiconductor substrate; and a protective diode formed of the well region, the guard ring region, and the substrate pickup region. As a result, the junction between the guard ring region and semiconductor substrate is situated under the substrate pickup region; the dispersion in the threshold voltage of protective diodes, which is caused by the positional variation of well region through mask positioning, can be decreased; and the value of threshold voltage can suitably be adjusted by changing the distance between the guard ring region and the substrate pickup region, and the protective resistor having a stable withstand voltage can be provided.

(2) The guard ring region with the first double-diffusion layer is formed including the low concentration diffusion layer formed in a self-aligned manner using the thick oxide film as a mask, and the high concentration diffusion layer having another impurity concentration higher than the low concentration diffusion layer; and the dispersion in the threshold voltage of protective diodes caused by the positional variation of well region through mask positioning can be decreased by forming the substrate pickup region, the low concentration diffusion layer, and the high concentration diffusion layer in self-aligned manner using the thick oxide layer as a mask. As a result, the junction breakdown during extracting the electric charges can be prevented.

(3) The low concentration diffusion layer is formed in the guard ring region simultaneously with the channel region. As a result, the low concentration diffusion layer in the guard ring in the LDMOS transistor can be formed without increasing either the number of process steps or production casts.

With respect to the semiconductor device according to the first and second embodiments:

(1) The protective diode is formed to have a rated voltage higher than a nominal rated voltage and a breakdown voltage lower than that of the transistor. As a result, the protective diode is capable of effectively protecting the LDMOS transistor, the protective transistor, and device elements connected thereto from the damage by ESD and noises.

(2) The guard ring region and the substrate pickup region are formed spatially separated from each other. As a result, the value of threshold voltage can suitably be adjusted by changing the distance between the guard ring region and the substrate pickup region, and the protective resistor having a stable withstand voltage can be provided.

(3) The transistor is provided with another thick oxide film formed simultaneously with the previously formed thick oxide film such that a gate electrode is formed to extend covering at least a portion of the former thick oxide film. As a result, the drain withstand voltage of the transistor can be increased.

(4) The thick oxide layer is formed with the LOCOS film which has excellent dimensional controllability. As a result, the dispersion in the threshold voltage of protective diodes caused by the positional variation of well region through mask positioning can be decreased.

(5) The thick oxide film is formed without embedded into the semiconductor substrate over the entire surface of the semiconductor substrate, having a cross section approximately of a trapezoidal shape. As a result, the on-resistance of the transistor can be decreased compared with the case of the LOCOS oxide films.

(6) The well region of the present semiconductor device is electrically connected to the apparatus configured to supply a source voltage to a peripheral circuit. As a result, the LDMOS transistor and device elements connected thereto can be protected from the damage by ESD and noises owning to the aforementioned stable capabilities of the protective diodes of the disclosure.

The fabrication of the semiconductor device set forth in the present description may be implemented under control of conventional general purpose microprocessors, appropriately programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification thus include also a computer-based product which may be hosted on a storage medium, and include instructions which can be used to program a microprocessor to perform a process in accordance with the present disclosure. This storage medium can include, but not limited to, any type of disc including floppy discs, optical discs, CD-ROMs, magneto-optical discs, ROMs, RAMs, EPROMs, EEPROMs, flash memory, magnetic or optical cards, or any type of media suitable for storing electronic instructions.

While the disclosure has been described in conjunction with the preferred embodiments, including specific materials, components, and device configurations, it is evident that many alternatives and variations will be apparent to those skilled in the art. Accordingly, the preferred embodiments of the disclosure as set forth herein are intended to be illustrative, not limiting. Various changes may be made without departing from the spirit and scope of the disclosure as defined in the following claims.

This application claims priority to Japanese Patent Application No. 2005-102773, filed with the Japanese Patent Office on Mar. 31, 2005, the entire contents of which are hereby incorporated by reference.

What is claimed is:

1. A semiconductor device comprising:
   a semiconductor substrate of a first conductivity type;
   a well region of a second conductivity type opposite to the first conductivity type, formed in said semiconductor substrate;
   a transistor formed in said well region;
   a guard ring region of the second conductivity type having an impurity concentration higher than said well region, formed in a periphery of said well region, and spatially separated from a boundary of said well region;
   a substrate pickup region of the first conductivity type having an impurity concentration higher than said semiconductor substrate, formed on the periphery of said well region in contact with said well region in said semiconductor substrate;
   a thick oxide film formed on the surface of said semiconductor substrate between said guard ring region and said substrate pickup region; and
   a protective diode formed of said well region, said guard ring region, and said substrate pickup region.

2. The semiconductor device according to claim 1, wherein said substrate pickup region is formed of a first double-diffusion layer including:

a low concentration diffusion layer of the first conductivity type having an impurity concentration higher than said semiconductor substrate, formed in a self-aligned manner using said thick oxide film as a mask, and a high concentration diffusion layer of the first conductivity type having another impurity concentration higher than said low concentration diffusion layer.

3. The semiconductor device according to claim 2, wherein said transistor is an LDMOS transistor, said LDMOS transistor comprising:

a channel diffusion layer of the first conductivity type, formed in said well region, said well region serving as a drain; and a source of the second conductivity type, formed in said channel diffusion layer, a portion of said channel diffusion layer on the surface of said semiconductor substrate immediately under a gate electrode serving as a channel region, and wherein said channel region is formed simultaneously with said low concentration diffusion layer.

4. The semiconductor device according to claim 2, wherein said transistor is an LDMOS transistor, said LDMOS transistor comprising:

a channel diffusion layer of the first conductivity type, formed in said well region, said well region serving as a drain; and a source of the second conductivity type, formed in said channel diffusion layer, a portion of said channel diffusion layer on the surface of said semiconductor substrate immediately under a gate electrode serving as a channel region, and wherein said LDMOS transistor further comprises a drain contact diffusion layer of the second conductivity type, formed in said well region, said drain contact diffusion layer being formed contiguously to said guard ring region.

5. The semiconductor device according to claim 4, wherein said guard ring region is formed of a second double-diffusion layer, said second double-diffusion layer being formed in a self-aligned manner using said thick oxide film as a mask, including:

a low concentration diffusion layer of the second conductivity type having an impurity concentration higher than said well region, and a high concentration diffusion layer of the second conductivity type having another impurity concentration higher than said low concentration diffusion layer.

6. The semiconductor device according to claim 5, wherein said protective diode is formed to have a rated voltage higher than a nominal rated voltage and a breakdown voltage lower than that of said transistor.

7. The semiconductor device according to claim 6, wherein said guard ring region and said substrate pickup region are formed spatially separated from each other.

8. The semiconductor device according to claim 7, wherein said transistor is provided with another thick oxide film formed simultaneously with said thick oxide film such that a gate electrode is formed to extend covering at least a portion of said another thick oxide film.

9. The semiconductor device according to claim 8, wherein said another thick oxide film is a LOCOS oxide film.

10. The semiconductor device according to claim 8, wherein said another thick oxide film is formed without being embedded into said semiconductor substrate, having a cross section approximately of a trapezoidal shape when viewed from thickness direction.

11. The semiconductor device according to claim 8, wherein said well region is electrically connected to a source terminal of an apparatus configured to supply a source voltage to a peripheral circuit.

12. The semiconductor device according to claim 1, wherein said protective diode is formed to have a rated voltage higher than a nominal rated voltage and a breakdown voltage lower than that of said transistor.

13. The semiconductor device according to claim 1, wherein said guard ring region and said substrate pickup region are formed spatially separated from each other.

14. The semiconductor device according to claim 1, wherein said transistor is provided with another thick oxide film formed simultaneously with said thick oxide film such that a gate electrode is formed to extend covering at least a portion of said another thick oxide film.

15. The semiconductor device according to claim 1, wherein said well region is electrically connected to a source terminal of an apparatus configured to supply a source voltage to a peripheral circuit.

16. The semiconductor device according to claim 1, wherein said thick oxide film borders said guard ring region and borders said substrate pickup region.

17. The semiconductor device according to claim 1, wherein said guard ring region surrounds said transistor.

* * * * *